(12) United States Patent
Shimizu et al.

(10) Patent No.: US 8,088,553 B2
(45) Date of Patent: Jan. 3, 2012

(54) POSITIVE RESIST COMPOSITION, METHOD OF FORMING RESIST PATTERN, AND POLYMERIC COMPOUND

(75) Inventors: Hiroaki Shimizu, Kawasaki (JP); Tsuyoshi Nakamura, Kawasaki (JP); Takayoshi Mori, Kawasaki (JP); Sanae Furuya, Kawasaki (JP); Daiju Shiono, Kawasaki (JP); Tomoyuki Hirano, Kawasaki (JP); Takahiro Dazai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 176 days.

(21) Appl. No.: 12/425,706

(22) Filed: Apr. 17, 2009

(65) Prior Publication Data
US 2009/0269694 A1 Oct. 29, 2009

(30) Foreign Application Priority Data
Apr. 24, 2008 (JP) .................................. 2008-114190

(51) Int. Cl.
- G03F 7/039 (2006.01)
- G03F 7/20 (2006.01)
- G03F 7/30 (2006.01)
- C08F 220/28 (2006.01)

(52) U.S. Cl. ............... 430/270.1; 430/326; 430/910; 526/328.5

(58) Field of Classification Search ............ None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,242,153 B1 | 6/2001 | Sato et al. | |
| 7,074,543 B2 | 7/2006 | Iwai et al. | |
| 7,078,562 B2 | 7/2006 | Furukawa et al. | |
| 7,323,287 B2 | 1/2008 | Iwai et al. | |
| 2005/0130058 A1* | 6/2005 | Rahman | 430/270.1 |
| 2005/0260525 A1 | 11/2005 | Takemoto et al. | |
| 2005/0266351 A1 | 12/2005 | Takemoto et al. | |
| 2008/0248421 A1* | 10/2008 | Fukuhara et al. | 430/281.1 |
| 2009/0130597 A1 | 5/2009 | Seshimo et al. | |
| 2009/0226842 A1 | 9/2009 | Shimizu et al. | |
| 2009/0317745 A1 | 12/2009 | Mimura et al. | |
| 2010/0062364 A1 | 3/2010 | Dazai et al. | |
| 2010/0086873 A1 | 4/2010 | Seshimo et al. | |
| 2010/0136480 A1 | 6/2010 | Motoike et al. | |
| 2010/0178609 A1 | 7/2010 | Dazai et al. | |
| 2010/0183981 A1 | 7/2010 | Matsumiya et al. | |
| 2010/0196821 A1 | 8/2010 | Dazai et al. | |
| 2010/0209848 A1 | 8/2010 | Dazai et al. | |
| 2010/0233623 A1 | 9/2010 | Kurosawa et al. | |
| 2010/0233624 A1 | 9/2010 | Kakinoya et al. | |
| 2010/0233626 A1 | 9/2010 | Shimizu et al. | |
| 2010/0304289 A1 | 12/2010 | Mimura et al. | |

FOREIGN PATENT DOCUMENTS

JP H09-208554 8/1997
(Continued)

OTHER PUBLICATIONS

Machine-assisted English translation of JP2009-62414 provided by JPO (Mar. 2009).*

(Continued)

Primary Examiner — Sin J. Lee
(74) Attorney, Agent, or Firm — Knobbe Martens Olson & Bear LLP

(57) ABSTRACT

A positive resist composition including a base component (A) which exhibits increased solubility in an alkali developing solution under action of acid and an acid-generator component (B) which generates acid upon exposure, the base component (A) including a polymeric compound (A1) having a structural unit (a0-1) represented by general formula (a0-1) (wherein $R^1$ represents a hydrogen atom, a lower alkyl group or a halogenated lower alkyl group; $R^8$ represents a divalent linking group; and $R^7$ represents an acid dissociable, dissolution inhibiting group) and a structural unit (a0-2) represented by general formula (a0-2) (wherein $R^3$ represents a hydrogen atom, a lower alkyl group or a halogenated lower alkyl group; $R^4$ represents a branched alkyl group of 3 or more carbon atoms; and each of $R^5$ and $R^6$ independently represents an alkyl group, wherein $R^5$ and $R^6$ are mutually bonded to form a ring).

[Chemical Formula 1]

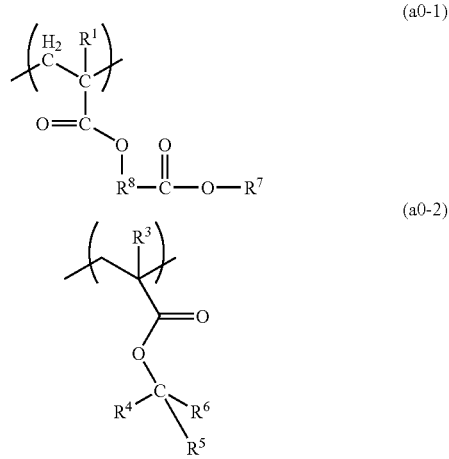

8 Claims, No Drawings

FOREIGN PATENT DOCUMENTS

| | | |
|---|---|---|
| JP | H11-035551 | 2/1999 |
| JP | H11-035552 | 2/1999 |
| JP | H11-035573 | 2/1999 |
| JP | 11 218924 A | 8/1999 |
| JP | H11-322707 | 11/1999 |
| JP | 2003-241385 | 8/2003 |
| JP | 2006-016379 | 1/2006 |
| JP | 2007-31355 | 2/2007 |
| JP | A-2008-032840 | 2/2008 |
| JP | A-2008-096743 | 4/2008 |
| JP | 2009-62414 * | 3/2009 |
| JP | A-2010-026478 | 2/2010 |
| KR | 10-1998-0080792 | 11/1998 |
| WO | WO 2004-074242 | 9/2004 |

OTHER PUBLICATIONS

Takemoto et al., "Tailoring thermal property of ArF resists resins through monomer structure modification for sub-70 nm contact hole application by reflow process". Proceedings of SPIE, vol. 5753, Sep. 14, 2005, pp. 584-591.

The Extended European Search Report issued in related European Patent Application No. 09153291.1, dated Jun. 15, 2009.

Decision for Grant of Patent issued in corresponding KR Application No. 10-2009-0013006 dated Jun. 28, 2011.

Notice of Allowance in issued on Jul. 22, 2011 in Korean Application No. 10-2009-0034593.

Office Action in U.S. Appl. No. 12/461,687 mailed Sep. 12, 2011.

* cited by examiner

POSITIVE RESIST COMPOSITION, METHOD OF FORMING RESIST PATTERN, AND POLYMERIC COMPOUND

TECHNICAL FIELD

The present invention relates to a novel polymeric compound which can be used as a base component for a positive resist composition, a positive resist composition containing the polymeric compound, and a method of forming a resist pattern using the positive resist composition.

Priority is claimed on Japanese Patent Application No. 2008-114190, filed Apr. 24, 2008, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use an exposure light source having a wavelength shorter than these excimer lasers, such as $F_2$ excimer lasers, electron beams, extreme ultraviolet radiation (EUV), and X rays.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist composition is used, which includes a base component that exhibits a changed solubility in an alkali developing solution under action of acid and an acid generator that generates acid upon exposure.

For example, a chemically amplified positive resist contains, as a base component (base resin), a resin which exhibits increased solubility in an alkali developing solution under action of acid, and an acid generator is typically used. With respect to a resist film formed by using such a resist composition, when acid is generated from the acid generator at exposed portions, the solubility of the resin component in an alkali developing solution is increased by the action of acid. As a result, the exposed portions become soluble in an alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (see, for example, Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the C-position.

[Patent Document 1] Japanese Unexamined Patent Application, First Publication No. 2003-241385

SUMMARY OF THE INVENTION

A further progress is made in lithography techniques and the application field for lithography techniques expands, development of a novel material for use in lithography will be strongly desired. Further, in the formation of a fine pattern (e.g., a pattern size of no more than 100 nm) having a narrow pitch, there was a problem that the pattern is deteriorated.

The present invention takes the above circumstances into consideration, with an object of providing a novel polymeric compound which can be used as a base component for a positive resist composition, a positive resist composition containing the polymeric compound, and a method of forming a resist pattern using the positive resist composition.

Specifically, a first aspect of the present invention is a positive resist composition including a base component (A) which exhibits increased solubility in an alkali developing solution under action of acid and an acid-generator component (B) which generates acid upon exposure, the base component (A) including a polymeric compound (A1) containing a structural unit (a0-1) represented by general formula (a0-1) shown below and a structural unit (a0-2) represented by general formula (a0-2) shown below.

[Chemical Formula 1.]

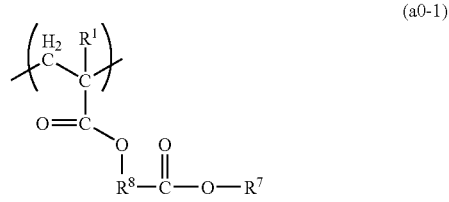

(a0-1)

In formula (a0-1), $R^1$ represents a hydrogen atom, a lower alkyl group or a halogenated lower alkyl group; $R^8$ represents a divalent linking group; and $R^7$ represents an acid dissociable, dissolution inhibiting group.

[Chemical Formula 2.]

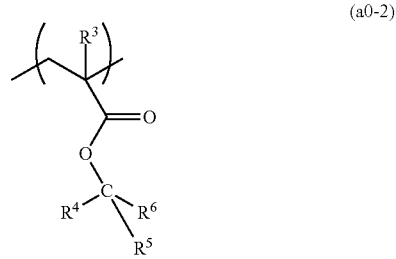

(a0-2)

In formula (a0-2), $R^3$ represents a hydrogen atom, a lower alkyl group or a halogenated lower alkyl group; $R^4$ represents a branched alkyl group of 3 or more carbon atoms; and each of $R^5$ and $R^6$ independently represents an alkyl group, wherein $R^5$ and $R^6$ are mutually bonded to form a ring.

A second aspect of the present invention is a method of forming a resist pattern, including: applying a positive resist composition of the first aspect to a substrate to form a resist film on the substrate; conducting exposure of the resist film; and alkali-developing the resist film to form a resist pattern.

A third aspect of the present invention is a polymeric compound including a structural unit (a0-1) represented by general formula (a0-1) shown below and a structural unit (a0-2) represented by general formula (a0-2) shown below.

[Chemical Formula 3.]

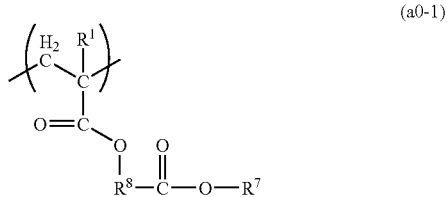

(a0-1)

In formula (a0-1), $R^1$ represents a hydrogen atom, a lower alkyl group or a halogenated lower alkyl group; $R^8$ represents a divalent linking group; and $R^7$ represents an acid dissociable, dissolution inhibiting group.

[Chemical Formula 4.]

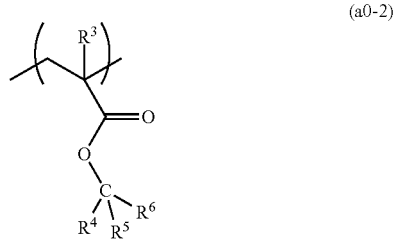

(a0-2)

In formula (a0-2), $R^3$ represents a hydrogen atom, a lower alkyl group or a halogenated lower alkyl group; $R^4$ represents a branched alkyl group of 3 or more carbon atoms; and each of $R^5$ and $R^6$ independently represents an alkyl group, wherein $R^5$ and $R^6$ are mutually bonded to form a ring.

In the present description and claims, the term "alkyl group" includes linear, branched or cyclic, monovalent saturated hydrocarbon group, unless otherwise specified. Further, the term "alkylene group" includes linear, branched or cyclic divalent saturated hydrocarbon group, unless otherwise specified.

A "lower alkyl group" is an alkyl group of 1 to 5 carbon atoms.

A "halogenated lower alkyl group" is a group in which part of or all of the hydrogen atoms of an alkyl group is substituted with halogen atoms. Examples of the halogen atoms include fluorine atoms, chlorine atoms, bromine atoms and iodine atoms.

The term "structural unit" refers to a monomer unit that contributes to the formation of a polymeric compound (polymer or copolymer).

The term "exposure" is used as a general concept that includes irradiation with any form of radiation.

EFFECT OF THE INVENTION

According to the present invention, there are provided a novel polymeric compound which can be used as a base component for a positive resist composition, a positive resist composition containing the polymeric compound, and a method of forming a resist pattern using the positive resist composition.

DETAILED DESCRIPTION OF THE INVENTION

Positive Resist Composition

The positive resist composition of the present invention includes a base component (A) (hereafter, referred to as "component (A)") which exhibits increased solubility in an alkali developing solution under action of acid and an acid-generator component (B) (hereafter, referred to as "component (B)") which generates acid upon exposure. Here, the term "base component" refers to an organic compound capable of forming a film.

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

<Component (A)>

The component (A) contains a polymeric compound (A1) including a structural unit (a0-1) represented by general formula (a0-1) and a structural unit (a0-2) represented by general formula (a0-2). Hereinbelow, each of the structural units will be described in detail.

<Structural Unit (a0-1)>

[Chemical Formula 5.]

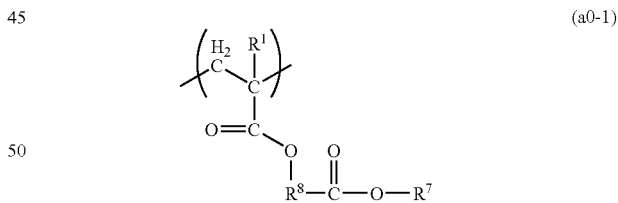

(a0-1)

In formula (a0-1), $R^1$ represents a hydrogen atom, a lower alkyl group or a halogenated lower alkyl group.

The lower alkyl group for $R^1$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group.

The halogenated lower alkyl group for $R^1$ is a group in which part of or all of the hydrogen atoms of the aforementioned alkyl group is substituted with halogen atoms. Examples of halogen atoms include fluorine atoms, chlorine atoms, bromine atoms and iodine atoms, and fluorine atoms are particularly desirable.

As $R^1$, a hydrogen atom, a lower alkyl group or a fluorinated lower alkyl group is preferable, and in terms of industrial availability, a hydrogen atom or a methyl group is particularly desirable.

As examples of the divalent linking group for $R^8$, a divalent hydrocarbon group which may have a substituent, and a divalent group containing a hetero atom can be given.

The hydrocarbon group "has a substituent" means that part of or all of the hydrogen atoms of the hydrocarbon group is substituted with groups or atoms other than hydrogen.

The hydrocarbon group may be either an aliphatic hydrocarbon group or an aromatic hydrocarbon group.

In the present description and claims, the term "aliphatic" is a relative concept used in relation to the term "aromatic", and defines a group or compound that has no aromaticity. The term "aliphatic hydrocarbon group" refers to a hydrocarbon group that has no aromaticity.

The aliphatic hydrocarbon group for $R^8$ may be either saturated or unsaturated, but is preferably saturated.

Specific examples of the aliphatic hydrocarbon group include linear or branched aliphatic hydrocarbon groups, and aliphatic hydrocarbon groups which contain a ring in the structure thereof.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable. Specific examples include alkylalkylene groups, such as alkylmethylene groups (e.g., —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—), alkylethylene groups (e.g., —CH($CH_3$)$CH_2$—, —CH($CH_3$)CH($CH_3$)—, —C($CH_3$)$_2CH_2$— and —CH($CH_2CH_3$)$CH_2$—), alkyltrimethylene groups (e.g., —CH($CH_3$)$CH_2CH_2$— and —$CH_2$CH($CH_3$)$CH_2$—), and alkyltetramethylene groups (e.g., —CH($CH_3$)$CH_2CH_2CH_2$— and —$CH_2$CH($CH_3$)$CH_2CH_2$—). As the alkyl group within the alkylalkylene group, a linear alkyl group of 1 to 5 carbon atoms is preferable.

The linear or branched hydrocarbon group (chain-like hydrocarbon group) may or may not have a substituent. Examples of substituents include a fluorine atom, a fluorinated lower alkyl group of 1 to 5 carbon atoms, and an oxygen atom (=O).

As examples of the aliphatic hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

With respect to a divalent group containing a hetero atom, a hetero atom is an atom other than carbon and hydrogen, and examples thereof include an oxygen atom, a nitrogen atom, a sulfur atom and a halogen atom.

Examples of divalent groups containing a hetero atom include —O—, —C(=O)—, —C(=O)—O—, —NH—, —$NR^{04}$— (in the formula, $R^{04}$ represents an alkyl group), —NH—C(=O)—, =N—, and a combination of at least one of these groups with the aforementioned divalent hydrocarbon group.

As $R^8$, a divalent group containing a hetero atom is preferable, and a linear group containing an oxygen atom as a hetero atom (e.g., an ester bond) is more preferable.

$R^7$ represents an acid dissociable, dissolution inhibiting group. When a polymeric compound (A1) is blended with the component (B) for a positive resist composition, the acid dissociable, dissolution inhibiting group exhibits an acid dissociability so as to be dissociated by action of acid generated from the component (B) upon exposure, and an alkali dissolution-inhibiting effect that renders the entire polymeric compound (A1) insoluble in an alkali developing solution prior to dissociation.

As the acid dissociable, dissolution inhibiting group for $R^7$, any of those which have been proposed as acid dissociable, dissolution inhibiting groups for a base resin of a chemically amplified resist may be used. Generally, groups that form either a cyclic or chain-like (linear or branched) tertiary alkyl ester with the carboxyl group of (meth)acrylic acid, and acetal-type acid dissociable, dissolution inhibiting groups such as alkoxyalkyl groups are widely known. In the present description, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) (wherein each of $R^{71}$ to $R^{73}$ independently represents a linear alkyl group of 1 to 5 carbon atoms) can be given. The group represented by the formula —C($R^{71}$)($R^{72}$)($R^{73}$) preferably has 4 to 8 carbon atoms, and specific examples include a tert-butyl group, a tert-pentyl group and a tert-heptyl group.

The term "aliphatic cyclic group" refers to a monocyclic group or polycyclic group that has no aromaticity.

The "aliphatic cyclic group" may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The "aliphatic cyclic group" is preferably a polycyclic group.

Examples of such aliphatic cyclic groups include groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, dicyclodecane, tricyclodecane or tetracyclododecane.

Examples of acid dissociable, dissolution inhibiting groups containing an aliphatic cyclic group include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 6.]

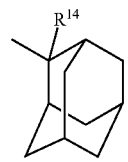 (1-1)

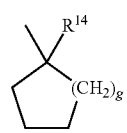 (1-2)

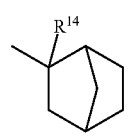 (1-3)

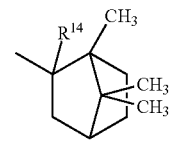 (1-4)

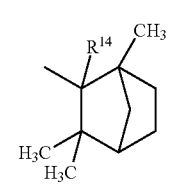 (1-5)

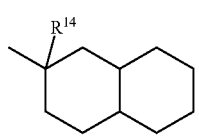 (1-6)

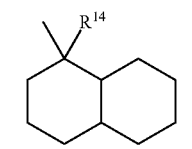 (1-7)

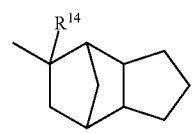 (1-8)

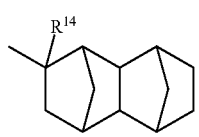 (1-9)

In the formulas above, $R^{14}$ represents a lower alkyl group; and g represents an integer of 0 to 8.

[Chemical Formula 7.]

(2-1)
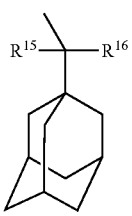

(2-2)
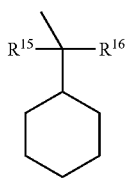

(2-3)
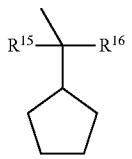

(2-4)
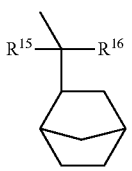

(2-5)
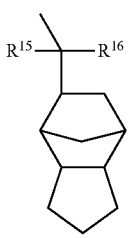

(2-6)
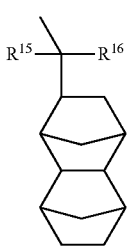

In the formulas above, each of $R^{15}$ and $R^{16}$ independently represents an alkyl group.

As the alkyl group for $R^{14}$ to $R^{16}$, a lower alkyl group is preferable, and a linear or branched alkyl group is more preferable. Specific examples include a methyl group, an ethyl group, a propyl group, an isopropyl group, an n-butyl group, an isobutyl group, a tert-butyl group, a pentyl group, an isopentyl group, and a neopentyl group. Among these, a methyl group, an ethyl group or an n-butyl group is preferable, and a methyl group or an ethyl group is more preferable.

g is preferably an integer of 0 to 3, more preferably 1 to 3, and still more preferably 1 or 2.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 8.]

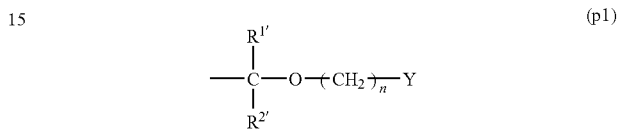
(p1)

In formula (p1), each of $R^{1\prime}$ and $R^{2\prime}$ independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As examples of the lower alkyl group for $R^{1\prime}$ and $R^{2\prime}$, the same as the lower alkyl groups for R above can be given. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 9.]

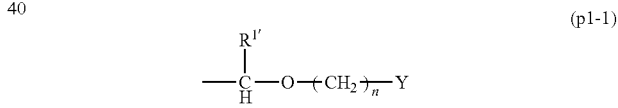
(p1-1)

In formula (p1-1), $R^{1\prime}$, n and Y are as defined above.

As the lower alkyl group for Y, the same lower alkyl groups as those described above for R above can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 10.]

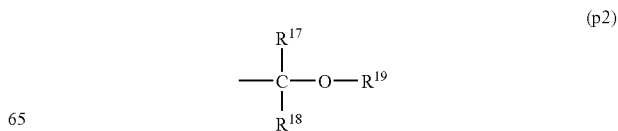
(p2)

In formula (p2), each of $R^{17}$ and $R^{18}$ independently represents a linear or branched alkyl group or a hydrogen atom; and $R^{19}$ represents a linear, branched or cyclic alkyl group; or each of $R^{17}$ and $R^{19}$ independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be given. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, each of $R^{17}$ and $R^{19}$ may independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

Specific examples of acetal-type acid dissociable, dissolution inhibiting groups include groups represented by formulas (3-1) to (3-12) shown below.

[Chemical Formula 11.]

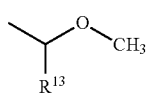

(3-1)

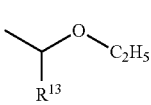

(3-2)

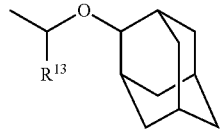

(3-3)

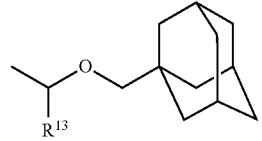

(3-4)

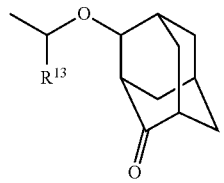

(3-5)

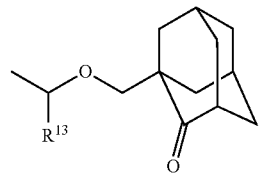

(3-6)

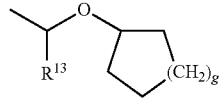

(3-7)

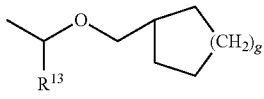

(3-8)

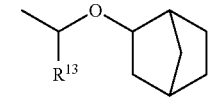

(3-9)

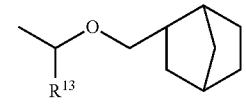

(3-10)

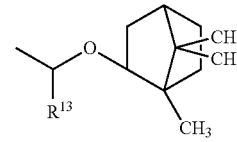

(3-11)

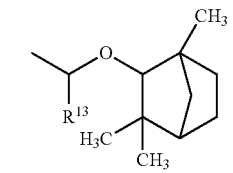

(3-12)

In the formulas above, $R^{13}$ represents a hydrogen atom or a methyl group; and g is as defined above.

In the present invention, $R^7$ is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

As the structural unit (a0-1), a structural unit represented by general formula (a0-1-1) shown below is particularly desirable.

[Chemical Formula 12.]

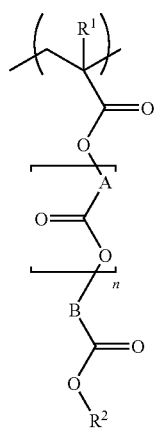

(a0-1-1)

In formula (a0-1-1), $R^1$ represents a hydrogen atom, a lower alkyl group or a halogenated lower alkyl group, and is as defined for $R^1$ in general formula (a0-1).

As examples of the divalent linking group for A, the same groups as those described above for $R^8$ in general formula (a0-1) can be given.

As A, a divalent hydrocarbon group which may have a substituent is preferable, more preferably a linear aliphatic hydrocarbon group, and still more preferably a linear alkylene group. Among linear alkylene groups, a linear alkylene group of 1 to 5 carbon atoms is preferable, and a methylene group or an ethylene group is particularly desirable.

As examples of the divalent linking group for B, the same groups as those described above for A can be given.

As B, a divalent hydrocarbon group which may have a substituent is preferable, more preferably a linear aliphatic hydrocarbon group, and still more preferably a linear alkylene group. Among linear alkylene groups, a linear alkylene group of 1 to 5 carbon atoms is preferable, and a methylene group or an ethylene group is particularly desirable.

$R^2$ represents an acid dissociable, dissolution inhibiting group, and is the same as defined for $R^7$ in general formula (a0-1).

$R^2$ is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

As the structural unit represented by general formula (a0-1-1), a structural unit represented by general formula (a0-1-1-1) or (a0-1-1-2) shown below is preferable.

[Chemical Formula 13.]

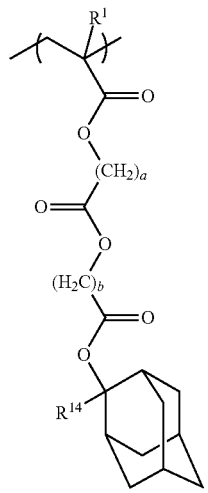

(a0-1-1-1)

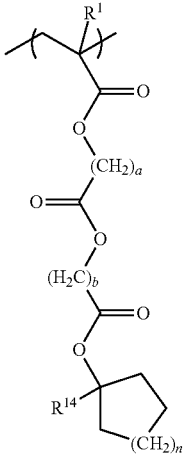

(a0-1-1-2)

In formulas (a0-1-1-1) and (a0-1-1-2), $R^1$ and $R^{14}$ are as defined above; a represents an integer of 1 to 10; b represents an integer of 1 to 10; and n represents an integer of 0 to 3.

a is preferably an integer of 1 to 5, and most preferably 1 or 2.

b is preferably an integer of 1 to 5, and most preferably 1 or 2.

n is preferably 1 or 2.

<Structural Unit (a0-2)>

[Chemical Formula 14.]

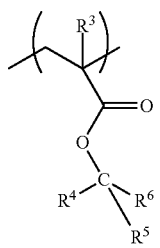

(a0-2)

In formula (a0-2), $R^3$ represents a hydrogen atom, a lower alkyl group or a halogenated lower alkyl group, and is as defined above for $R^1$.

$R^4$ represents a branched alkyl group of 3 or more carbon atoms, and examples thereof include branched alkyl groups of 3 to 10 carbon atoms. Among these, branched alkyl groups of 3 to 5 carbon atoms are preferable. Specific examples of such branched alkyl groups include an isopropyl group, an isobutyl group, a tert-butyl group, an isopentyl group and a neopentyl group, and an isopropyl group is particularly desirable.

Each of $R^5$ and $R^6$ independently represents an alkyl group, wherein $R^5$ and $R^6$ are mutually bonded to form a ring. As the alkyl group for $R^5$ and $R^6$, a linear, branched or cyclic group of 1 to 10 carbon atoms is preferable, and specific examples thereof include a methyl group, an ethyl group, a propyl group, an isopropyl group, an n-butyl group, an isobutyl group, a tert-butyl group, a pentyl group, an isopentyl group, a neopentyl group, a cyclopentyl group and a cyclohexyl group.

The cyclic group formed by the bonding of the $R^5$ group and the $R^6$ group may or may not have a substituent. Examples of substituents include a lower alkyl group of 1 to 5 carbon atoms, a fluorine atom, a fluorinated alkyl group of 1 to 5 carbon atoms, and an oxygen atom (=O).

The basic ring of the cyclic group exclusive of substituent(s) is not limited to being constituted from only carbon and hydrogen (not limited to hydrocarbon groups), but is preferably a hydrocarbon group. Further, the "hydrocarbon group" may be either saturated or unsaturated, but is preferably saturated.

The cyclic group is preferably a polycyclic group.

As examples of such cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, can be given. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the structural unit (a0-2) represented by general formula (a0-2), a structural unit represented by general formula (a0-2-1) or (a0-2-2-) shown below is preferable.

[Chemical Formula 15.]

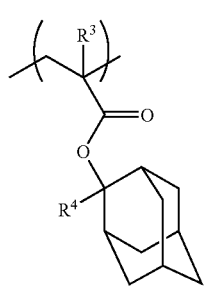

(a0-2-1)

-continued

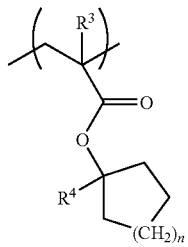

(a0-2-2)

In formulas (a0-2-1) and (a0-2-2), $R^3$ and $R^4$ are as defined above; and n represents an integer of 0 to 3.

With respect to each of the structural unit (a0-1) and the structural unit (a0-2) contained in the polymeric compound (A1), one type of structural unit may be used alone, or two or more types of structural units may be used in combination.

The polymeric compound (A1) may be either a polymer consisting of the structural unit (a0-1) and the structural unit (a0-2), or a copolymer further including a structural unit other than the structural unit (a0-1) and the structural unit (a0-2).

In the polymeric compound (A1), the amount of each of the structural unit (a0-1) and the structural unit (a0-2) based on the combined total of all structural units constituting the polymeric compound (A1) is preferably 5 to 50 mol %.

In the polymeric compound (A1), the amount of the structural unit (a0-1) is more preferably 5 to 35 mol %, and most preferably 10 to 30 mol %.

In the polymeric compound (A1), the amount of the structural unit (a0-2) is more preferably 10 to 50 mol %, and most preferably 20 to 50 mol %.

By ensuring that the amount of each of the structural unit (a0-1) and the structural unit (a0-2) is at least as large as the lower limit of the above-mentioned range, a pattern can be easily formed using a resist composition prepared from the polymeric compound (A1). On the other hand, by ensuring that the amount of each of the structural unit (a0-1) and the structural unit (a0-2) is no more than the upper limit of the above-mentioned range, a good balance can be achieved with the other structural units.

Especially, in consideration of improvement in various lithography properties (e.g., resolution, pattern shape and line edge roughness) and dissolution contrast of the positive resist composition containing the polymeric compound (A1), the amount of each of the structural unit (a0-1) and the structural unit (a0-2) based on the combined total of all structural units constituting the polymeric compound (A1) is preferably 5 mol % or more, and more preferably 10 mol % or more.

When the polymeric compound (A1) is a copolymer including a structural unit other than the structural unit (a0-1) and the structural unit (a0-2), the structural unit other than the structural unit (a0-1) and the structural unit (a0-2) is not particularly limited, and any structural unit conventionally used for a base resin of a chemically amplified resist can be used. As examples of preferable structural units, structural units derived from an acrylate ester, such as the below-described structural units (a1) to (a3) can be given.

It is preferable that the polymeric compound (A1) have a structural unit (a2), as well as the structural units (a0-1) and (a0-2).

Further, it is preferable that the polymeric compound (A1) have a structural unit (a3), as well as the structural units (a0-1) and (a0-2), or the structural units (a0-1), (a0-2) and (a2).

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of substituents include a lower alkyl group or a halogenated lower alkyl group. With respect to the "structural unit derived from an acrylate ester", the "α-position (the carbon atom on the α-position)" refers to the carbon atom having the carbonyl group bonded thereto, unless specified otherwise.

With respect to the acrylate ester, as examples of the lower alkyl group and halogenated lower alkyl group for the substituent at the α-position, the same as lower alkyl groups and halogenated lower alkyl groups as those described above for $R^1$ can be given.

It is preferable that a hydrogen atom, a lower alkyl group or a halogenated lower alkyl group is bonded to the C-position of the acrylate ester, more preferably a hydrogen atom, a lower alkyl group or a fluorinated lower alkyl group. In terms of industrial availability, a hydrogen atom or a methyl group is particularly desirable.

<Structural Unit (a2)>

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the polymeric compound (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 16.]

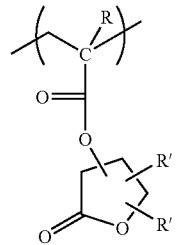
(a2-1)

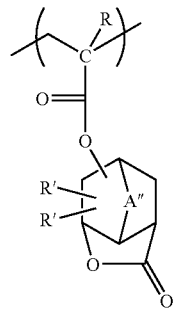
(a2-2)

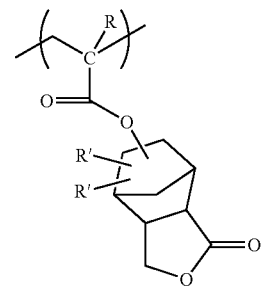
(a2-3)

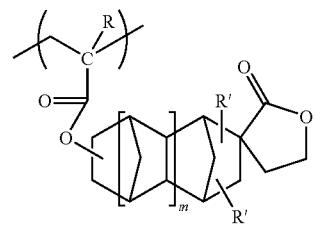
(a2-4)

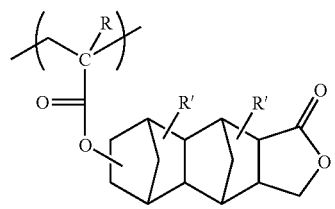
(a2-5)

In the formulas above, R represents a hydrogen atom, a lower alkyl group or a halogenated lower alkyl group; R' represents a hydrogen atom, a lower alkyl group, an alkoxy group of 1 to 5 carbon atoms or —COOR" (wherein R" represents a hydrogen atom or a linear, branched or cyclic alkyl group of 1 to 15 carbon atoms); m represents 0 or 1; and A" represents an alkylene group of 1 to 5 carbon atoms or an oxygen atom.

In general formulas (a2-1) to (a2-5), R is the same as $R^1$ in the structural unit (a0-1).

The lower alkyl group for R' is the same as the lower alkyl group for $R^1$ defined above.

When R" is a linear or cyclic alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

Specific examples of alkylene groups of 1 to 5 carbon atoms for A" include a methylene group, ethylene group, n-propylene group and isopropylene group.

In the structural units represented by general formulas (a2-1) to (a2-5), in consideration of industrial availability, R' is preferably a hydrogen atom.

In general formula (a2-1), the bonding position of the oxygen atom (—O—) on the γ-butyrolactone ring is not particularly limited, but is preferably the C-position or the β-position.

Specific examples of structural units represented by general formulas (a2-1) to (a2-5) above are shown below.

[Chemical Formula 17.]

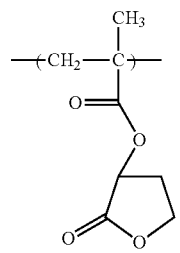
(a2-1-1)

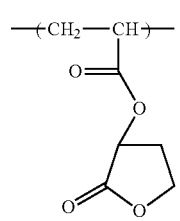
(a2-1-2)

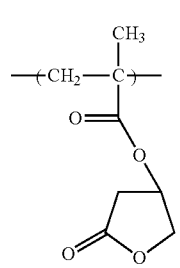
(a2-1-3)

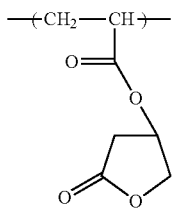
(a2-1-4)

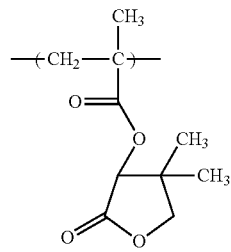
(a2-1-5)

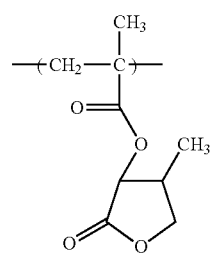
(a2-1-6)

[Chemical Formula 18.]

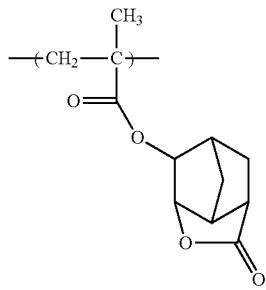
(a2-2-1)

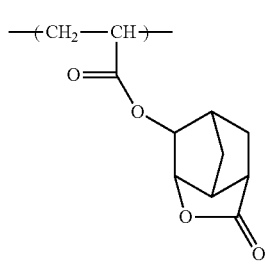
(a2-2-2)

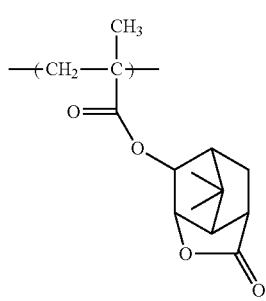
(a2-2-3)

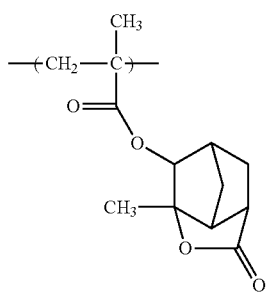 (a2-2-4)
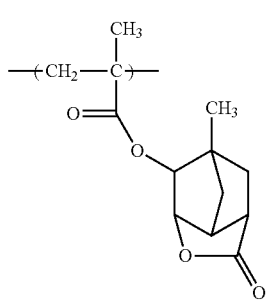 (a2-2-5)
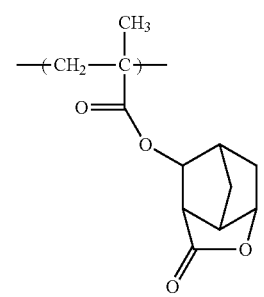 (a2-2-6)
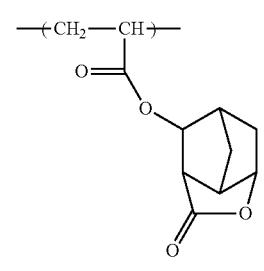 (a2-2-7)
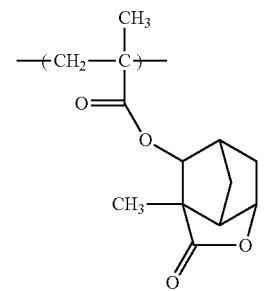 (a2-2-8)
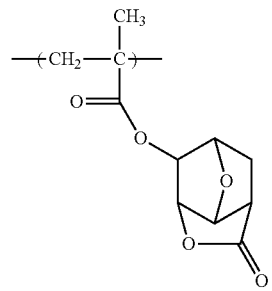 (a2-2-9)
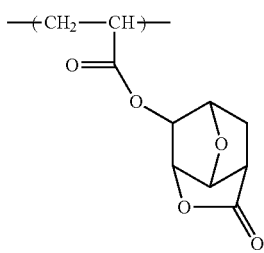 (a2-2-10)
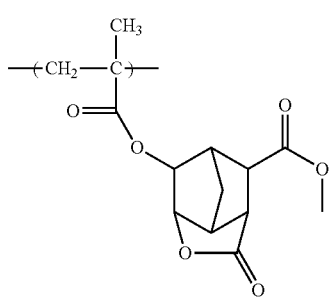 (a2-2-11)
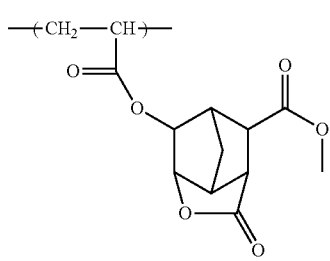 (a2-2-12)
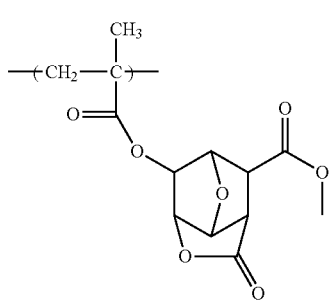 (a2-2-13)
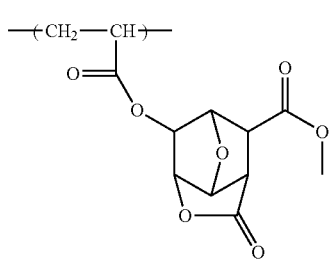 (a2-2-14)

-continued
[Chemical Formula 19.]
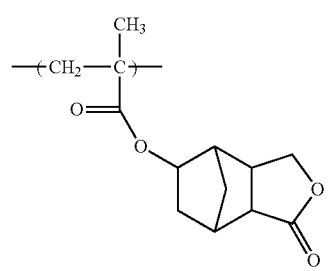 (a2-3-1)
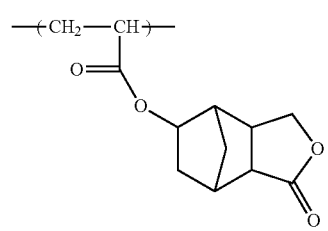 (a2-3-2)
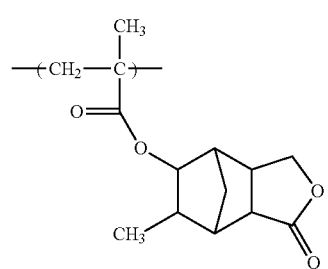 (a2-3-3)
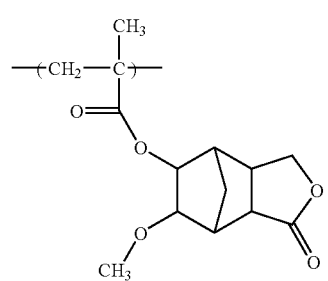 (a3-3-4)
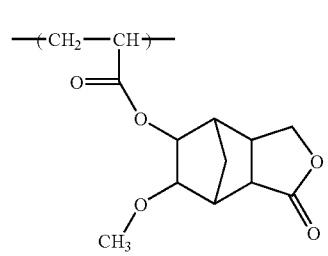 (a3-3-5)
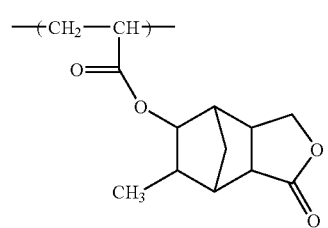 (a3-3-6)
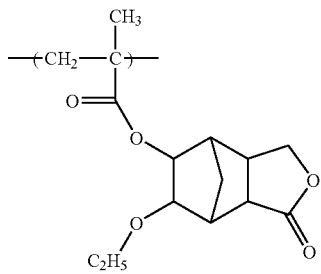 (a3-3-7)
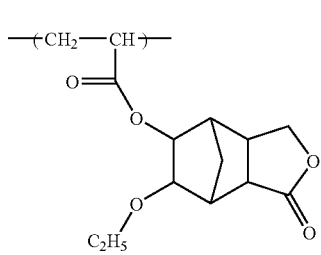 (a3-3-8)
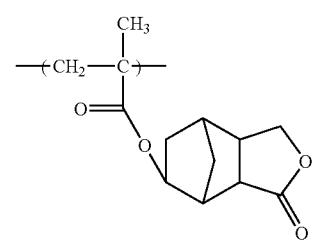 (a3-3-9)
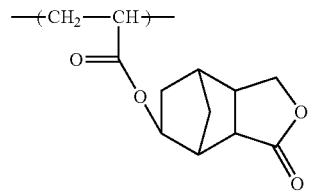 (a3-3-10)
[Chemical Formula 20.]
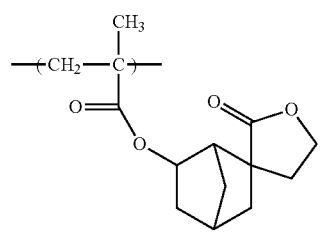 (a2-4-1)
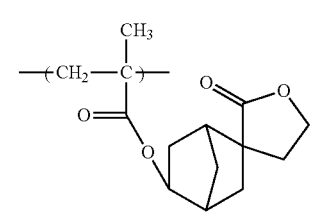 (a2-4-2)

(a2-4-3)
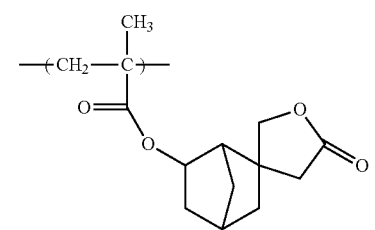
(a2-4-4)
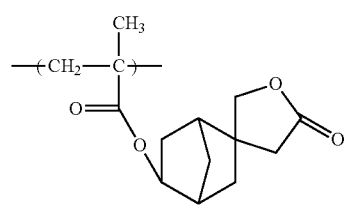
(a2-4-5)
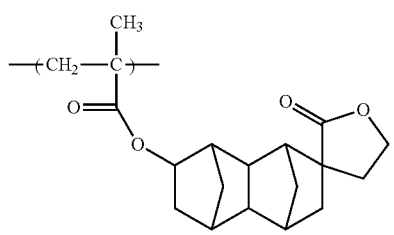
(a2-4-6)
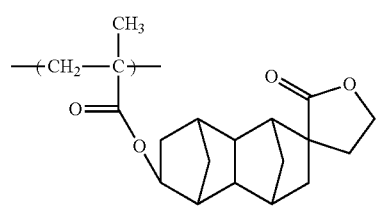
(a2-4-7)
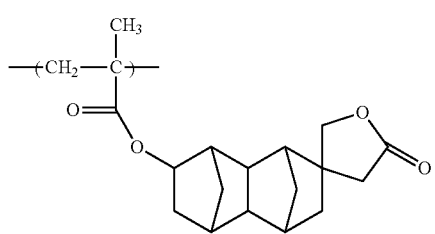
(a2-4-8)
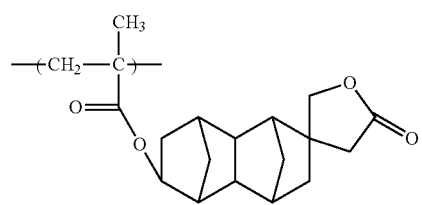
(a2-4-9)
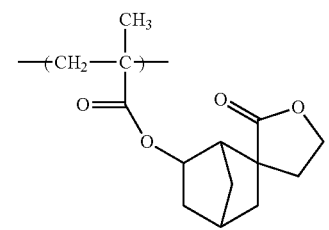
(a2-4-10)
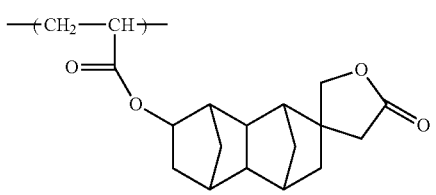
(a2-4-11)
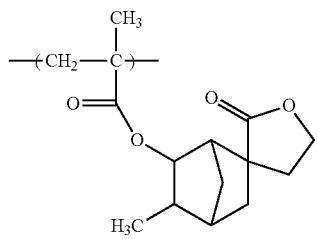
(a2-4-12)
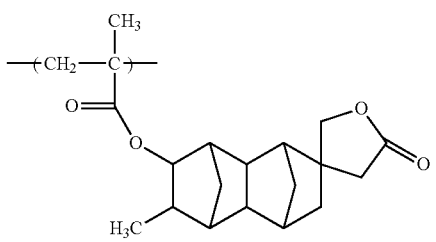
[Chemical Formula 21.]
(a2-5-1)
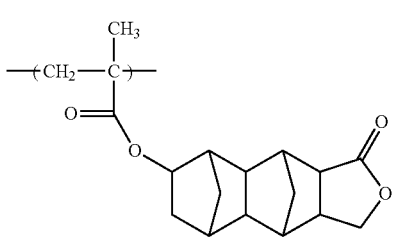
(a2-5-2)
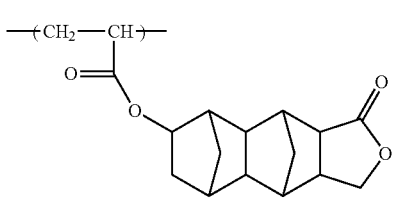
(a2-5-3)
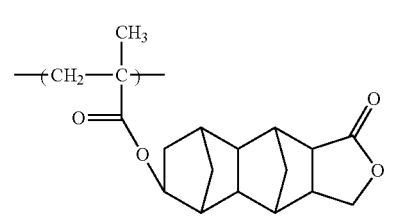
(a2-5-4)
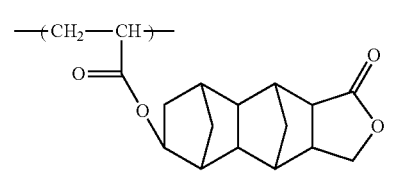

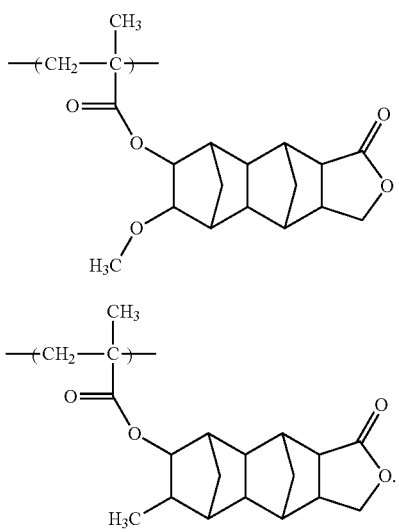

(a2-5-5)

(a2-5-6)

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-1-3), (a2-1-4), (a2-2-1), (a2-2-2), (a2-3-1), (a2-3-2), (a2-3-9) and (a2-3-10).

As the structural unit (a2), one type of structural unit may be used, or two or more types may be used in combination.

In the polymeric compound (A1), the amount of the structural unit (a2) based on the combined total of all structural units constituting the polymeric compound (A1) is preferably 5 to 60 mol %, more preferably 10 to 55 mol %, and still more preferably 20 to 55 mol %. By ensuring that the amount of the structural unit (a2) is at least as large as the lower limit of the above-mentioned range, the effect of using the structural unit (a2) can be satisfactorily achieved. On the other hand, by ensuring that the amount of the structural unit (a2) is no more than the upper limit of the above-mentioned range, a good balance can be achieved with the other structural units.

<Structural Unit (a3)>

The structural unit (a3) is a structural unit derived from an acrylate ester containing a polar group-containing aliphatic hydrocarbon group.

When the polymeric compound (A1) has the structural unit (a3), the hydrophilicity of the polymeric compound (A1) is improved, and hence, the compatibility of the polymeric compound (A1) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), (a3-3) and (a3-4) shown below are preferable.

[Chemical Formula 22.]

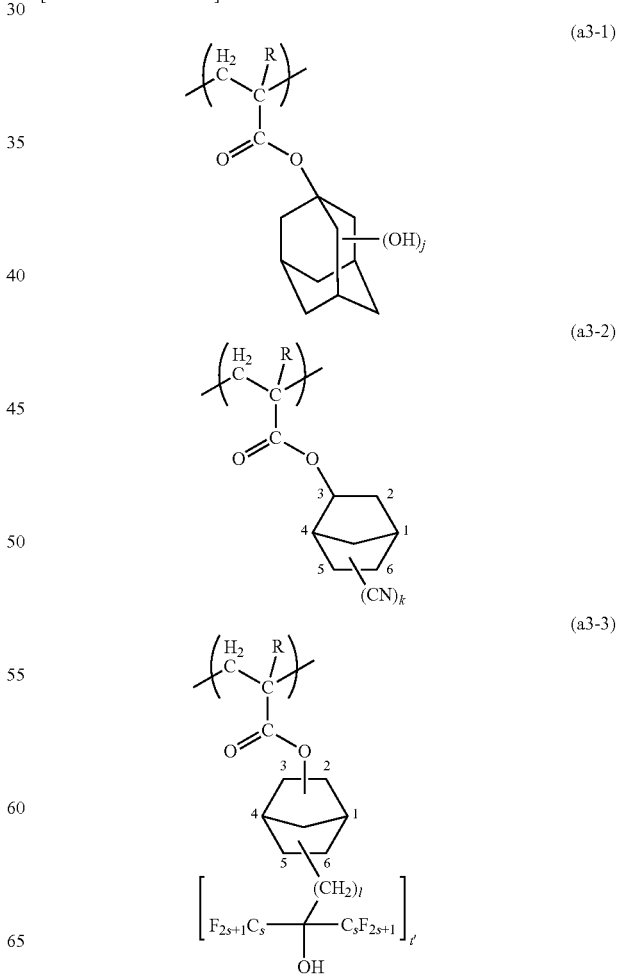

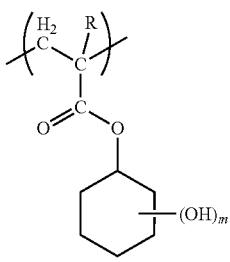

(a3-4)

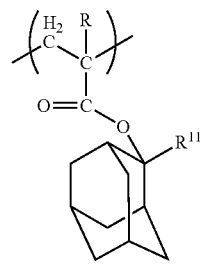

(a1-1-01)

In the formulas (a3-1) to (a3-4), R is as defined above; j is an integer of 1 to 3; k is an integer of 1 to 3; t' is an integer of 1 to 3; l is an integer of 1 to 5; s is an integer of 1 to 3; and m represents an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, l is preferably 1 and s is preferably 1. Further, in formula (a3-3), it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

In formula (a3-4), m is preferably 1 or 2, and more preferably 1.

As the structural unit (a3), one type of structural unit may be used, or two or more types may be used in combination.

In the polymeric compound (A1), the amount of structural unit (a3) based on the combined total of all structural units constituting the polymeric compound (A1) is preferably 5 to 50 mol %, more preferably 5 to 40 mol %, and still more preferably 5 to 25 mol %.

<Structural Unit (a1)>

The polymeric compound (A1) may also have a structural unit (a1) derived from an acrylate ester having an acid dissociable, dissolution inhibiting group, other than the structural units (a0-1) and (a0-2), as long as the effects of the present invention are not impaired.

As the structural unit (a1), structural units represented by general formulas (a1-1-01) and (a1-1-02) shown below are preferable.

In the polymeric compound (A1), the amount of structural unit (a1) based on the combined total of all structural units constituting the polymeric compound (A1) is preferably 10 mol % or less, more preferably 5 mol % or less, and it is particularly desirable that the polymeric compound (A1) contains no structural unit (a1).

[Chemical Formula 23.]

In formula (a0-1-01), R represents a hydrogen atom, a lower alkyl group or a halogenated lower alkyl group; and $R^{11}$ represents a methyl group or an ethyl group.

[Chemical Formula 24.]

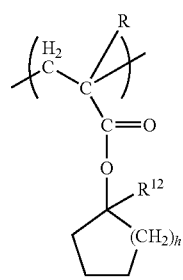

(a1-1-02)

In formula (a1-1-02), R represents a hydrogen atom, a lower alkyl group or a halogenated lower alkyl group; $R^{12}$ represents a methyl group or an ethyl group; and h represents an integer of 1 to 3.

The polymeric compound (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from a tricyclodecanyl group, an adamantyl group, a tetracyclododecanyl group, an isobornyl group, and a norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 25.]

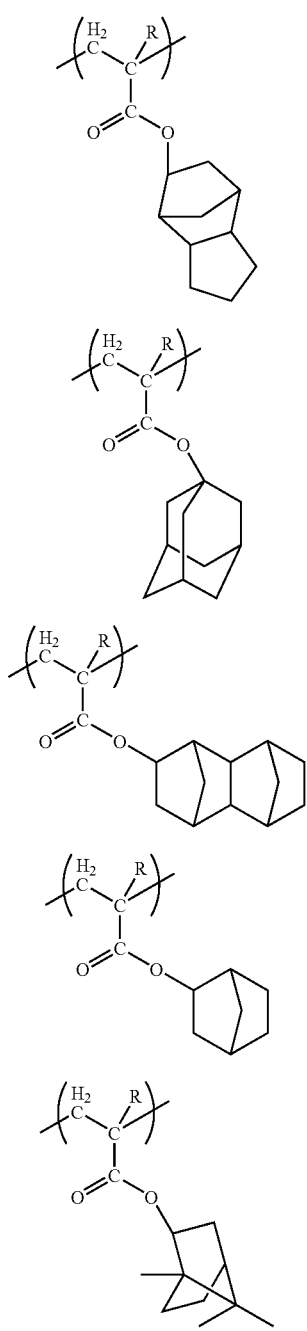

wherein R is as defined above.

When the structural unit (a4) is included in the polymeric compound (A1), the amount of the structural unit (a4) based on the combined total of all the structural units that constitute the polymeric compound (A1) is preferably within the range from 1 to 30 mol %, and more preferably from 10 to 20 mol %.

In the present invention, the polymeric compound (A1) is preferably a copolymer having the structural units (a0-1), (a0-2), (a2) and (a3). Examples of such copolymers include a copolymer consisting of structural units (a0-1), (a0-2), (a2) and (a3), a copolymer consisting of structural units (a0-1), (a0-2), (a2), (a3) and (a4), and a copolymer consisting of structural units (a0-1), (a0-2), (a2), (a3) and (a1).

As the polymeric compound (A1), a copolymer having a combination of four structural units shown in formula (A1-11) or (A1-12) below is particularly desirable.

[Chemical Formula 26.]

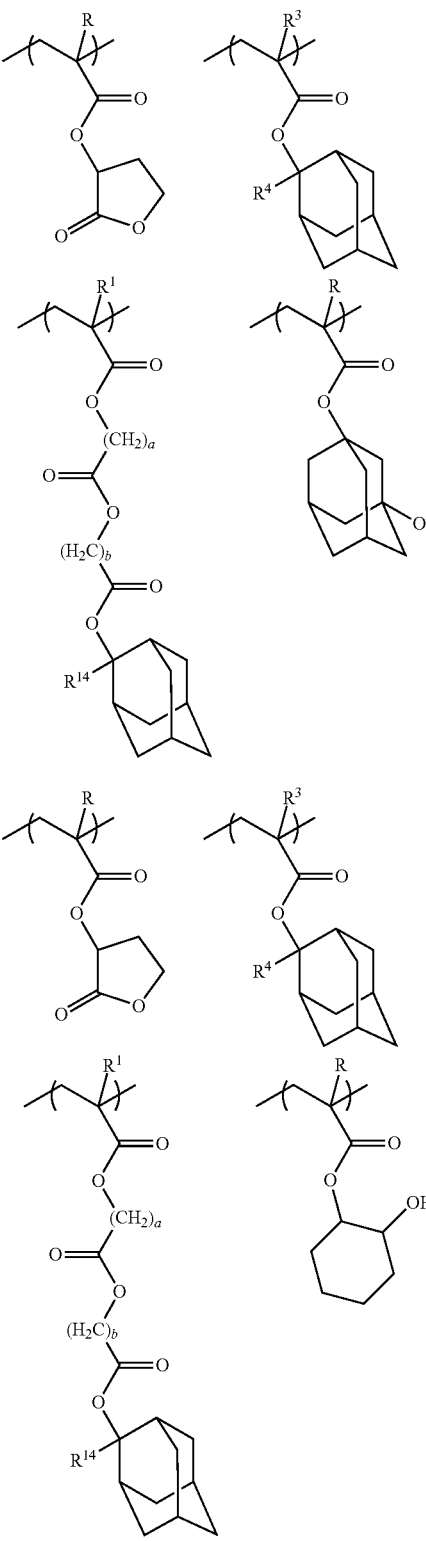

In formulas (A1-11) and (A1-12), R, $R^3$, $R^4$, $R^1$, a, b and $R^{14}$ are as defined above.

In formulas (A1-11) and (A1-12), the plurality of R may be the same or different from each other.

The polymeric compound (A1) can be obtained, for example, by a conventional radical polymerization or the like of monomers for deriving the objective structural units (e.g., the compound (I) and, if desired, monomers corresponding with other structural units), using a radical polymerization initiator such as azobisisobutyronitrile (AIBN) or dimethyl-2,2'-azobis(2-methylpropionate) (product name: V-601; manufactured by Wako Pure Chemical Industries, Ltd.).

Furthermore, in the polymeric compound (A1), by using a chain transfer agent such as $HS-CH_2-CH_2-CH_2-C(CF_3)_2-OH$, a $-C(CF_3)_2-OH$ group can be introduced at the terminals of the main chain of the polymeric compound (A1). Such a copolymer in which a hydroxyalkyl group in which some of the hydrogen atoms of the alkyl group are substituted with fluorine atoms has been introduced at the terminals of the main chain is effective in reducing developing defects and LER (line edge roughness: unevenness of the side walls of a line pattern).

The weight average molecular weight (Mw) (the polystyrene equivalent value determined by gel permeation chromatography) of the polymeric compound (A1) is not particularly limited, but is preferably 2,000 to 50,000, more preferably 3,000 to 30,000, and most preferably 5,000 to 20,000. By ensuring that the weight average molecular weight is no more than the upper limit of the above-mentioned range, the polymeric compound (A1) exhibits satisfactory solubility in a resist solvent when used as a resist. On the other hand, by ensuring that the weight average molecular weight is at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the polymeric compound (A1), one type of compound may be used, or a combination of two or more types may be used.

In the component (A), the amount of the polymeric compound (A1) based on the total weight of the component (A) is preferably 50 to 100% by weight, more preferably 80 to 100% by weight, and may be even 100% by weight.

The component (A) may contain "a base component which exhibits increased solubility in an alkali developing solution under action of acid" other than the polymeric compound (A1) (hereafter, referred to as "component (A2)"), as long as the effects of the present invention are not impaired.

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a4) can be used.

As the component (A2), one type of resin may be used, or two or more types of resins may be used in combination.

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-1) or (b-2) shown below can be used.

[Chemical Formula 27.]

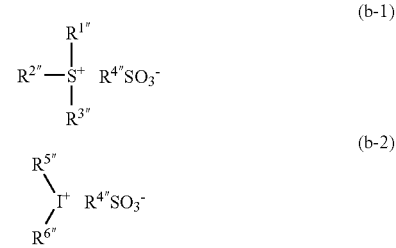

In the formulas above, $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom; and $R^{4\prime\prime}$ represents an alkyl group, a halogenated alkyl group, an aryl group or an alkenyl group which may have a substituent, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$, to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1'''}$ to $R^{3'''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

When two of $R^{1'''}$ to $R^{3'''}$ in formula (b-1) are bonded to each other to form a ring with the sulfur atom, it is preferable that the two of $R^{1'''}$ to $R^{3'''}$ form a 3 to 10-membered ring including the sulfur atom, and it is particularly desirable that the two of $R^{1'''}$ to $R^{3'''}$ form a 5 to 7-membered ring including the sulfur atom.

When two of $R^{1'''}$ to $R^{3'''}$ in formula (b-1) are bonded to each other to form a ring with the sulfur atom, the remaining one of $R^{1'''}$ to $R^{3'''}$ is preferably an aryl group. As examples of the aryl group, the same as the above-mentioned aryl groups for $R^{1'''}$ to $R^{3'''}$ can be given.

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X-Q^1-Y^1-$ (wherein, $Q^1$ represents a divalent linking group containing an oxygen atom; $Y^1$ represents an alkylene group of 1 to 4 carbon atoms which may have a substituent or a fluorinated alkylene group of 1 to 4 carbon atoms which may have a substituent; and X represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of the hetero atom as a substituent for $R^{4'''}$ include an oxygen atom, a nitrogen atom, and a sulfur atom.

In the group represented by the formula "$X-Q^1-Y-$", $Q^1$ represents a divalent linking group containing an oxygen atom.

$Q^1$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon, oxygen atom-containing linking groups such as an oxygen atom (ether linkage; —O—), an ester linkage (—C(=O)—O—), an amide linkage (—C(=O)—NH—), a carbonyl group (—C(=O)—), and a carbonate linkage (—O—C(=O)—O—); and combined groups of the non-hydrocarbon, oxygen-containing linking group with an alkylene group. Examples of the above combined groups include —$R^{91}$—O—, —$R^{92}$—O—C(=O)—, and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and still more preferably 1 to 3 carbon atoms.

Specific examples of the alkylene group include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2CH_2$—, —CH($CH_2CH_3$)$CH_2$—, and —CH($CH_2CH_2CH_3$)$CH_2$—; a trimethylene group (n-propylene group) [—$CH_2CH_2CH_2$—]; an alkyltrimethylene group such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—]. $Q^1$ is preferably a divalent linking group containing an ester linkage or ether linkage, and more preferably a group of —$R^{91}$—O—, —$R^{92}$—O—C(=O)—, or —C(=O)—O—$R^{93}$—O—C(=O)—.

In the group represented by the formula $X-Q^1-Y^1-$, as the alkylene group for $Y^1$, the same alkylene group as those described above for $Q^1$ in which the number of carbon atoms is 1 to 4 can be used.

As the fluorinated alkylene group for $Y^1$, groups in which part of or all of the hydrogen atoms in the alkylene group are substituted with fluorine atoms can be used.

Specific examples of $Y^1$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2$$CF_2$—, —CF($CF_2CF_3$)$CF_2$—, —CF($CF_2CF_2CF_3$)—, and —C($CF_3$)($CF_2CF_3$)—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, and —C($CF_3$)$_2CH_2$—; —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)

$CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluororinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, and —$CF(CF_2CF_3)CF_2$—; —$CH_2CF_2$—, —$CH_2CH_2CF_2$—, and —$CH_2CF_2CF_2$—; —$CH_2CH_2CH_2CF_2$—, —$CH_2CH_2CF_2CF_2$—, and —$CH_2CF_2CF_2CF_2$—. Of these, —$CF_2$—, —$CF_2CF_2$—, —$CF_2CF_2CF_2$—, or —$CH_2CF_2CF_2$— is preferable, —$CF_2$—, —$CF_2CF_2$—, or —$CF_2CF_2CF_2$— is more preferable, and —$CF_2$— is still more preferable.

The alkylene group or fluorinated alkylene group for $Y^1$ may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In the group represented by the formula "X-$Q^1$-$Y^1$—", the hydrocarbon group for X may be either an aromatic hydrocarbon group or an aliphatic hydrocarbon group. The aromatic hydrocarbon group is a hydrocarbon group containing an aromatic ring.

The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms described above does not include the number of carbon atoms in the substituent.

Specific examples of aromatic hydrocarbon groups include aryl groups in which one hydrogen atom has been removed from an aromatic hydrocarbon ring such as a phenyl group, a biphenyl group, a fluorenyl group, a naphthyl group, an anthryl group, and a phenanthryl group; and arylalkyl groups such as a benzyl group, a phenethyl group, a 1-naphthylmethyl group, a 2-naphthylmethyl group, a 1-naphthylethyl group, and a 2-naphthylethyl group. The alkyl chain in the arylalkyl group preferably has 1 to 4 carbon atoms, more preferably 1 or 2, and still more preferably 1.

The aromatic hydrocarbon group may have a substituent. For example, part of the carbon atoms which constitutes an aromatic ring included in the aromatic hydrocarbon group may be substituted with a hetero atom, or part of the hydrogen atoms bonded to an aromatic ring included in the aromatic hydrocarbon group may be substituted with a substituent.

Examples of the former case include a heteroaryl group in which a part of the carbon atoms which constitutes the ring of the aryl group described above has been substituted with a hetero atom such as an oxygen atom, a sulfur atom, and a nitrogen atom; and a heteroarylalkyl group in which part of the carbon atoms which constitutes the aromatic hydrocarbon ring of the arylalkyl group described above has been substituted with a hetero atom.

On the other hand, examples of substituents of the aromatic hydrocarbon group in the latter case include an alkyl group, an alkoxy group, a halogen atom, a halogenated alkyl group, a hydroxyl group, and an oxygen atom (=O).

The alkyl group for the substituent in the aforementioned aromatic hydrocarbon group is preferably an alkyl group of 1 to 5 carbon atoms, and most preferably a methyl group, an ethyl group, a propyl group, an n-butyl group, or a tert-butyl group.

The alkoxy group for the substituent in the aforementioned aromatic hydrocarbon group is preferably an alkoxy group of 1 to 5 carbon atoms, and more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent in the aforementioned aromatic hydrocarbon group include a fluorine atom, a chlorine atom, a bromine atom, and an iodine atom. Of these, a fluorine atom is preferable.

Examples of the halogenated alkyl group for the substituent in the aforementioned aromatic hydrocarbon group include groups in which part of or all of the hydrogen atoms of the above alkyl group are substituted with the halogen atoms.

The aliphatic hydrocarbon group for X may be either a saturated aliphatic hydrocarbon group or an unsaturated aliphatic hydrocarbon group. Further, the aliphatic hydrocarbon group may be linear, branched, or cyclic.

In the aliphatic hydrocarbon group for X, part of the carbon atoms which constitute the aliphatic hydrocarbon group may be substituted with a substituent containing a hetero atom, or part of or all of the hydrogen atoms which constitute the aliphatic hydrocarbon group may be substituted with a substituent containing a hetero atom.

There is no particular limitation on the "hetero atom" in X, as long as it is an atom other than a carbon atom and a hydrogen atom. Examples thereof include a halogen atom, an oxygen atom, a sulfur atom, and a nitrogen atom. Examples of the halogen atom include a fluorine atom, a chlorine atom, an iodine atom, and a bromine atom.

The substituent containing a hetero atom may be a group consisting of a hetero atom, or a group containing a group or an atom other than the hetero atom.

As the substituent which may substitute a part of the carbon atoms constituting the aforementioned aliphatic hydrocarbon group for X, for example, groups of —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, or —S(=O)$_2$—O— can be used. If the aliphatic hydrocarbon group for X is cyclic, these substituents may be included in the ring structure.

As the substituent which may be substituted for part of or all of the hydrogen atoms constituting the aforementioned aliphatic hydrocarbon group for X, for example, an alkoxy group, a halogen atom, a halogenated alkyl group, a hydroxyl group, an oxygen atom (=O), or a cyano group can be used.

The alkoxy group is preferably an alkoxy group of 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom include a fluorine atom, a chlorine atom, a bromine atom, and an iodine atom. Of these, a fluorine atom is preferable.

Examples of the halogenated alkyl group include a group in which part of or all of the hydrogen atoms in an alkyl group of 1 to 5 carbon atoms, such as a methyl group, an ethyl group, a propyl group, an n-butyl group, or a tert-butyl group, are substituted with the halogen atoms.

The aliphatic hydrocarbon group for X is preferably a linear or branched saturated hydrocarbon group, a monovalent linear or branched unsaturated hydrocarbon group, or a cyclic aliphatic hydrocarbon group (aliphatic cyclic group).

The linear saturated hydrocarbon group (alkyl group) preferably has 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of the monovalent linear monounsaturated hydrocarbon group include a vinyl group, a propenyl group (allyl group) and a butynyl group. Examples of the monovalent branched unsaturated hydrocarbon group include a 1-methylpropenyl group and a 2-methylpropenyl group.

Of these, as the unsaturated hydrocarbon group, a propenyl group is particularly desirable.

The aliphatic cyclic group may be either a monocyclic group or a polycyclic group.

The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

If the aliphatic cyclic group does not contain a substituent containing a hetero atom in the ring structure, the aliphatic cyclic group is preferably a polycyclic group, more preferably a group in which one or more hydrogen atoms have been removed from a polycycloalkane, and most preferably a group in which one or more hydrogen atoms have been removed from an adamantane.

If the aliphatic cyclic group contains a substituent containing a hetero atom in the ring structure, the substituent containing a hetero atom is preferably —O—, —C(=O)—O—, —S—, —S(=O)$_2$—, or —S(=O)$_2$—O—. Specific examples of such aliphatic cyclic groups include groups represented by the formulas (L1) to (L5), and (S1) to (S4) shown below.

[Chemical Formula 28.]

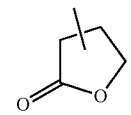
(L1)

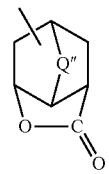
(L2)

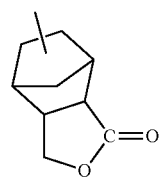
(L3)

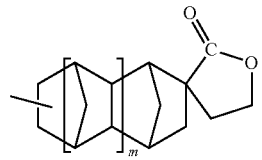
(L4)

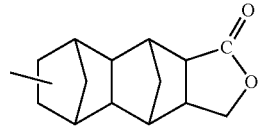
(L5)

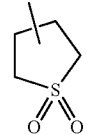
(S1)

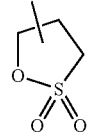
(S2)

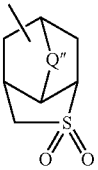
(S3)

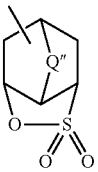
(S4)

In the formulas above, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q″, $R^{94}$ and $R^{95}$, the same alkylene groups as those described above for $R^{91}$ to $R^{93}$ can be used.

In these aliphatic cyclic groups, a part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituents for substituting part of or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In formula (b-2), $R^{5\prime\prime\prime}$ and $R^{6\prime\prime\prime}$ each independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be used.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be used.

It is particularly desirable that both of $R^{5\prime\prime\prime}$ and $R^{6\prime\prime\prime}$ represents a phenyl group.

As $R^{4\prime\prime\prime}$ in formula (b-2), the same groups as those mentioned above for $R^{4\prime\prime\prime}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl) sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl) phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alylsulfonate such as methanesulfonate, n-propanesulfonate, n-butanesulfonate, or n-octanesulfonate.

Furthermore, onium salts in which the anion moiety of these onium salts are replaced by an anion moiety represented by any one of formulas (b1) to (b7) shown below can be used.

[Chemical Formula 29.]

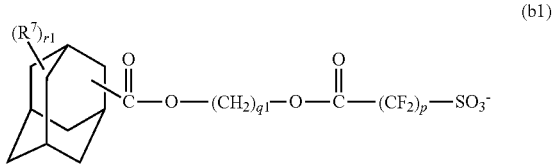

(b1)

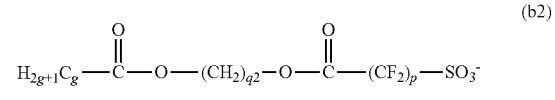

(b2)

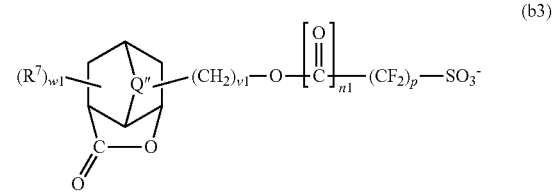

(b3)

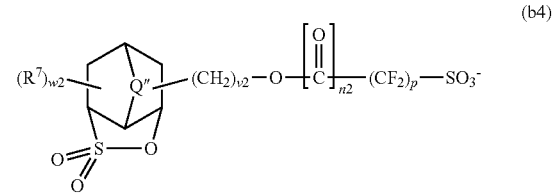

(b4)

(b5)

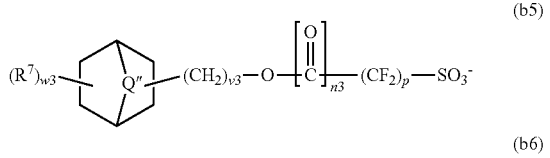

(b6)

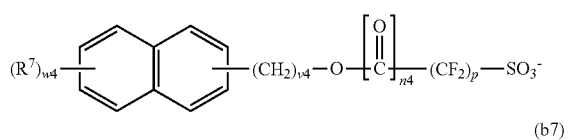

(b7)

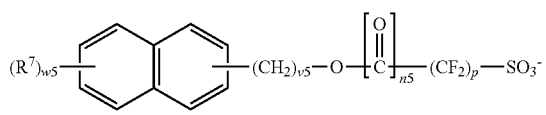

In the formulas (b1) to (b7), p represents an integer of 1 to 3; each of q1 and q2 independently represents an integer of 1 to 5; r1 represents an integer of 0 to 3; g represents an integer of 1 to 20; $R^7$ represents a substituent; each of n1 to n5 independently represents 0 or 1; each of v1 to v5 independently represents an integer of 0 to 3; each of w1 to w5 independently represents an integer of 0 to 3; and Q" is as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1 and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 30.]

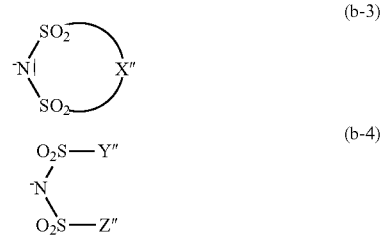

In formulas (b-3) and (b-4) above, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the better the solubility in a resist solvent.

Further, in the alkylene group of X" or the alkyl group of Y" and Z", it is preferable that the number of hydrogen atoms substituted with fluorine atoms is as large as possible, as the acid strength increases, and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 31.]

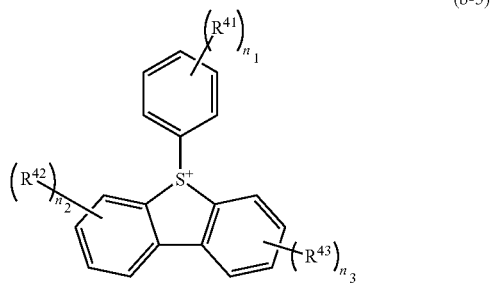

(b-5)

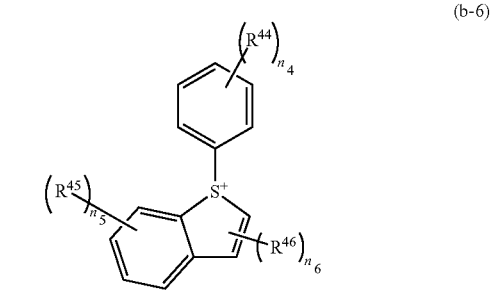

(b-6)

In formulas (b-5) and (b-6) above, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 32.]

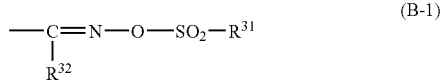

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 33.]

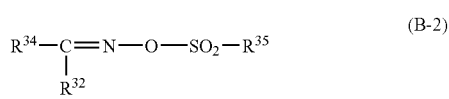

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 34.]

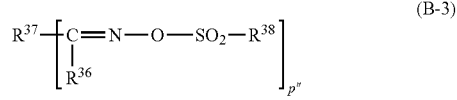

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Further, as preferable examples, the following can be given.

[Chemical Formula 35.]

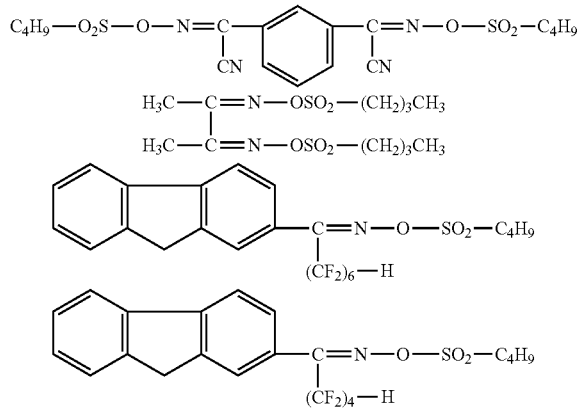

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types may be used in combination.

In the present invention, as the component (B), it is preferable to use an onium salt having a fluorinated alkylsulfonic acid ion, which may have a substituent, as the anion moiety.

In the resist composition for immersion exposure according to the present invention, the amount of the component (B) relative to 100 parts by weight of the component (A) is preferably 0.5 to 50 parts by weight, more preferably 1 to 30 parts by weight, and most preferably 2 to 20 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

In the positive resist composition of the present invention, for improving the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although an aliphatic amine, and particularly a secondary aliphatic amine or tertiary aliphatic amine is preferable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine.

Among these, trialkylamines of 5 to 10 carbon atoms and alkylalcoholamines are preferable, tri-n-pentylamine, diethanolamine and stearyldiethanolamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris {2-(1-methoxyethoxy)ethyl}amine, tris {2-(1-ethoxyethoxy)ethyl}amine, tris {2-(1-ethoxypropoxy) ethyl}amine and tris[2-{2-(2-hydroxyethoxy)ethoxy}ethyl] amine.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent (S)>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The positive resist composition of the present invention described above is a novel composition essentially unknown in the art.

By using the positive resist composition of the present invention, a resist pattern can be formed on a substrate with high resolution and reduced level of line edge roughness (LER).

"LER" refers to the unevenness (roughness) of the side walls of a resist pattern. LER can cause distortions around the holes in a hole pattern, and fluctuations in the line width in line and space patterns, and consequently has the potential to adversely affect the formation of very fine semiconductor elements, and improvement of LER has been desired in the art.

Further, by using the positive resist composition of the present invention in the formation of a hole pattern, the level of circularity of the holes and uniformity (CDU) of the hole diameter (CD) is improved, and as a result, a resist pattern in which holes having an excellent shape are spaced with a narrow pitch can be formed.

The reason why the aforementioned effects can be achieved has not been elucidated yet, but is presumed as follows. By virtue of containing the component (A1) having both of the structural unit (a0-1) and the structural unit (a0-2), it is presumed that the difference in solubility between exposed portions and unexposed portions in an alkali developing solution (i.e., dissolution contrast) becomes significantly large, as compared to that in a conventional positive resist composition. In the structural unit (a0-1), the side-chain portion is long, and an oxygen (—O—) atom and a carbonyl group, which are electron attracting groups, are introduced into the side-chain portion. As a result, it is presumed that the acid dissociable, dissolution inhibiting group at the terminal of the structural unit (a0-1) is readily dissociated, and the dissolution contrast in the formation of a fine pattern is improved.

<<Method of Forming a Resist Pattern>>

The method of forming a resist pattern according to the present invention includes: applying a positive resist composition of the present invention to a substrate to form a resist film on the substrate; conducting exposure of the resist film; and alkali-developing the resist film to form a resist pattern.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As an example of the inorganic film, an inorganic antireflection film (inorganic BARC) can be given. As an example of the organic film, an organic antireflection film (organic BARC) can be given.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beams (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

The positive resist composition of the present invention is also applicable to a double exposure method or a double patterning method.

<<Polymeric Compound>>

The polymeric compound of the present invention contains a structural unit (a0-1) represented by general formula (a0-1) and a structural unit (a0-2) represented by general formula (a0-2).

The explanation of the polymeric compound of the present invention is the same as the explanation of the polymeric compound (A1) which is described as the component (A) of the positive resist composition of the present invention.

As described above, the polymer compound (A1) can be obtained, for example, by a conventional radical polymerization or the like of the monomers corresponding with each of the objective structural units, using a radical polymerization initiator such as azobisisobutyronitrile (AIBN) and dimethyl-2,2'-diazobis(2-methylpropionate).

For example, as a monomer for deriving the structural unit (a0-1), a compound (I) represented by general formula (I) shown below can be used.

[Chemical Formula 36.]

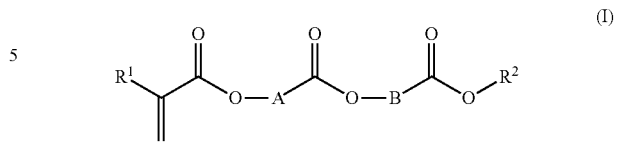

In formula (I), $R^1$, A, B and $R^2$ are as defined above.

The compound (I) is not particularly limited, and can be produced by a conventional method.

For example, the compound (I) can be produced by a production method (1) shown below.

Production Method (1)

A production method including the steps of: reacting a compound represented by the general formula (I-1) shown below (hereafter, referred to as "compound (I-1)") with a compound represented by general formula (I-2) shown below (hereafter, referred to as "compound (I-2)"), thereby obtaining a compound represented by general formula (I-3) shown below (hereafter, referred to as "compound (I-3)") (hereafter, this step is referred to as "first step"); and reacting the compound (I-3) with a compound represented by general formula (I-4) shown below (hereafter, referred to as "compound (I-4)"), thereby obtaining the compound (I) (hereafter, this step is referred to as "second step").

[Chemical Formula 37.]

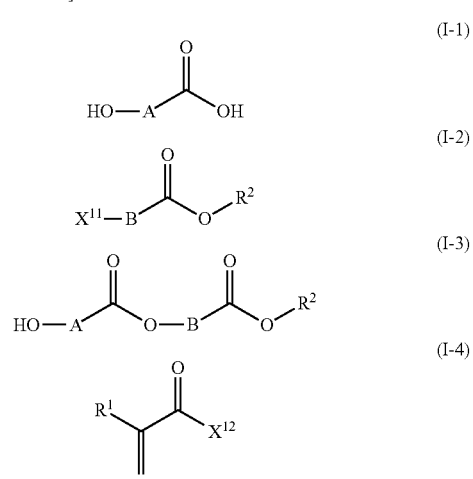

In the formulas above, $R^1$ represents a hydrogen atom, a lower alkyl group or a halogenated lower alkyl group; A represents a divalent linking group; B represents a divalent linking group; $R^2$ represents an acid dissociable, dissolution inhibiting group; and each of $X^{11}$ and $X^{12}$ independently represents a halogen atom.

$R^1$, A, B, and $R^2$ in the above formulas (I-1) to (I-4) are respectively as defined for $R^1$, A, B, and $R^2$ in general formula (I).

Each of $X^{11}$ and $X^{12}$ independently represents a halogen atom. Examples of halogen atoms include a bromine atom, a chlorine atom, an iodine atom, and a fluorine atom.

In terms of reactivity, the halogen atom for $X^{11}$ and $X^{12}$ is preferably a chlorine atom or a bromine atom.

[First Step]

The compound (I-1) can be reacted with the compound (I-2) by a conventional method. For example, the compound (I-1) can be allowed to come in contact with the compound (I-2) in a reaction solvent in the presence of a base. Such a method can be conducted, for example, by adding the compound (I-2) to a solution obtained by dissolving the compound (I-1) in a reaction solvent, in the presence of a base.

As the compound (I-1) and the compound (I-2), commercially available compounds may be used. Alternatively, the compound (I-1) and the compound (I-2) may be synthesized.

Examples of the compound (I-2) include 2-methyl-2-adamantyloxycarbonylmethyl chloride, 2-ethyl-2-adamantyloxycarbonylmethyl chloride, 1-methyl-1-cyclohexyloxycarbonylmethyl chloride, 1-ethyl-1-cyclohexyloxycarbonylmethyl chloride, 1-methyl-1-cyclopentyloxycarbonylmethyl chloride, and 1-ethyl-1-cyclopentylcarbonylmethyl chloride.

As the reaction solvent, any reaction solvent capable of dissolving the compounds (I-1) and (I-2) as raw materials can be used, and specific examples include tetrahydrofuran (THF), acetone, dimethylformamide (DMF), dimethylacetamide, dimethylsulfoxide (DMSO) and acetonitrile.

Examples of the base include inorganic bases such as sodium hydride and $K_2CO_3$, and organic bases such as triethylamine, 4-dimethylaminopyridine (DMAP) and pyridine.

In the first step, it is particularly desirable to use $K_2CO_3$.

The amount of the compound (I-2) added is preferably within the range of 1 to 100 times the molar amount of the compound (I-1), and more preferably 1 to 50 times the molar amount of the compound (I-1).

The reaction temperature is preferably within the range of 0 to 50° C., and more preferably 5 to 40° C.

The reaction time depends on the reactivity of the compounds (I-1) and (I-2), the reaction temperature or the like. However, in general, the reaction time is preferably 1 to 24 hours, and more preferably 3 to 12 hours.

After the reaction, the reaction mixture can be directly used in the following step, or the compound (I-3) within the reaction mixture may be separated and purified. The separation and purification can be conducted by a conventional method. For example, any one of concentration, solvent extraction, crystallization, recrystallization and chromatography can be used alone, or two or more of these methods may be used in combination.

[Second Step]

The method of reacting the compound (I-3) with the compound (I-4) is not particularly limited. For example, the compound (I-4) can be added to a solution in which the compound (I-3) obtained in the first step is dissolved, in the presence of a base.

As the solution in which the compound (I-3) is dissolved, the reaction mixture obtained in step 1 may be directly used, or the compound (I-3) separated and purified from the reaction mixture may be dissolved in a reaction solvent.

As the reaction solvent, any reaction solvent capable of dissolving the compound (I-3) as a raw material can be used, and the same as those described above for the reaction solvent in the first step can be used.

As the base, the same as those described above for the base in the first step can be used. Especially in the second step, triethylamine is preferably used.

The amount of the compound (I-4) added is preferably 1 to 2 times the molar amount of the compound (I-3), more preferably 1 to 1.5 times the molar amount of the compound (I-3).

The reaction temperature is preferably 0 to 50° C., more preferably 5 to 40° C., and most preferably room temperature.

The reaction time varies, depending on the reactivity of the compound (I-3) and the compound (I-4), the reaction temperature, and the like. However, in general, the reaction time is preferably 1 to 24 hours, more preferably 3 to 12 hours.

After the reaction, the compound (I) within the reaction mixture may be separated and purified. The separation and purification can be conducted by a conventional method. For example, any one of concentration, solvent extraction, crystallization, recrystallization and chromatography can be used alone, or two or more of these methods may be used in combination.

The structure of the compound obtained in the steps above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

As a monomer for deriving the structural unit (a0-2), a compound represented by general formula (II) shown below can be used.

[Chemical Formula 38.]

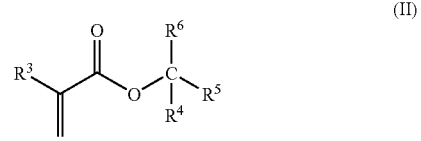

(II)

In formula (II), $R^3$, $R^4$, $R^5$ and $R^6$ are as defined above.

The compound (II) is not particularly limited, and can be produced by a conventional method.

For example, the compound (II) can be produced by a production method (2) shown below.

Production Method (2)

A production method including the step of reacting a compound represented by general formula (II-1) shown below (hereafter, referred to as "compound (II-1)") with a compound represented by general formula (II-2) shown below (hereafter, referred to as "compound (II-2)"), thereby obtaining the compound (II).

[Chemical Formula 39.]

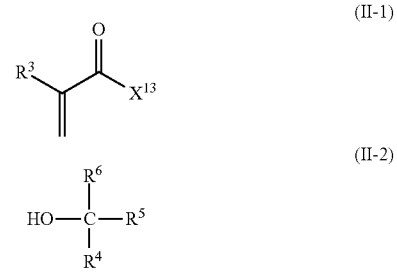

In formulas (II-1) and (II-2), $R^3$, $R^4$, $R^5$ and $R^6$ are as defined above; and $X^{13}$ represents a halogen atom.

In formulas (II-1) and (II-2), $R^3$, $R^4$, $R^5$ and $R^6$ are respectively as defined above for $R^3$, $R^4$, $R^5$ and $R^6$ in general formula (II). $X^{13}$ represents a halogen atom, and examples thereof include the same halogen atoms as those described above for $X^{11}$ and $X^{12}$.

The method of reacting the compound (II-1) with the compound (II-2) is not particularly limited. For example, the compound (II-1) can be added to a solution in which the compound (II-2) is dissolved, in the presence of a base. As the compound (II-1) and the compound (II-2), commercially available compounds may be used. Alternatively, the compound (II-1) and the compound (II-2) may be synthesized.

As the reaction solvent, any reaction solvent capable of dissolving the compounds (II-1) and (II-2) as raw materials can be used, and examples thereof include the same reaction solvents as those described above in the explanation of the production method of the compound (I).

Examples of bases include the same bases as those described above in the explanation of the production method of the compound (I).

The amount of the compound (II-1) added is preferably within the range of 1 to 2 times the molar amount of the compound (II-2), and more preferably 1 to 1.5 times the molar amount of the compound (II-2).

The reaction temperature is preferably within the range of 0 to 50° C., more preferably 5 to 40° C., and it is particularly desirable to conduct the reaction at room temperature.

The reaction time depends on the reactivity of the compounds (II-1) and (II-2), the reaction temperature or the like. However, in general, the reaction time is preferably 1 to 24 hours, and more preferably 3 to 12 hours.

After the reaction, the compound (II) contained in the reaction mixture may be separated and purified. The separation and purification can be conducted by a conventional method. For example, any one of concentration, solvent extraction, crystallization, recrystallization and chromatography can be used alone, or two or more of these methods may be used in combination.

The structure of the compound obtained in the step above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

The polymeric compound (A1) of the present invention is a novel compound essentially unknown in the art.

For example, in the case where the polymeric compound (A1) is blended with an acid-generator component (B) which generates acid upon exposure in a positive resist composition, when acid is generated from the acid-generator component (B) upon exposure (irradiation of radial rays), the bond between $R^7$ within the structural unit (a0-1) and the oxygen atom to which $R^7$ is bonded is broken by the action of the generated acid, and $R^7$ is dissociated. As a result, the solubility of the polymeric compound (A1) in an alkali developing solution is increased.

Therefore, the polymeric compound (A1) is useful as a base resin for a chemically amplified positive resist composition, and can be preferably used as the base component (A) for the positive resist composition of the present invention.

EXAMPLES

As follows is a description of examples of the present invention, although the scope of the present invention is by no way limited by these examples.

Synthesis Example 1

Synthesis of 2-(2-(2-methyl-2-adamantyloxy)-2-oxoethoxy)-2-oxoethanol 37.6 g (494 mmol) of glycolic acid, 700 mL of DMF, 86.5 g (626 mmol) of potassium carbonate, and 28.3 g (170 mmol) of potassium iodide were charged into to a 2 L three-neck flask equipped with a thermometer, a cooling pipe, and a stirrer, followed by stirring at room temperature for 30 minutes. Then, 300 ml of a dimethylformaldehyde solution containing 100 g (412 mmol) of 2-methyl-2-adamantyl chloroacetate was gradually added thereto. The resultant was heated to 40° C., and stirred for 4 hours. Subsequently, 2,000 ml of diethylether was added to the reaction mixture, followed by filtration. The resulting solution was washed with 500 ml of distilled water three time, followed by crystallization using a mixed solvent containing 300 ml of toluene and 200 ml of heptane, thereby obtaining 78 g of an objective compound in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results above, it was confirmed that the obtained compound was 2-(2-(2-methyl-2-adamantyloxy)-2-oxoethoxy)-2-oxoethanol.

Synthesis Example 2

Synthesis of 2-(2-(2-methyl-2-adamantyloxy)-2-oxoethoxy)-2-oxoethyl methacrylate (compound 3)

165 g (584 mmol) of 2-(2-(2-methyl-2-adamantyloxy)-2-oxoethoxy)-2-oxoethanol, 2,000 ml of THF, 105 ml (754 mmol) of triethylamine, and 0.165 g (1,000 ppm) of p-methoxyphenol were added to and dissolved in a 2 L three-neck flask equipped with a thermometer, a cooling pipe, and a stirrer. Then, 62.7 ml (648 mmol) of methacryloyl chloride was gradually added thereto while cooling in an ice bath. The temperature of the resultant was elevated to room temperature, and the resultant was stirred for 3 hours. Subsequently, 1,000 ml of diethylether was added thereto, followed by washing with 200 ml of distilled water 5 times. Thereafter, the extraction liquid was concentrated, thereby obtaining 198 g of an objective compound (compound 3) in the form of a colorless liquid (yield: 97%, GC purity: 99%).

The results of instrumental analysis of the obtained compound 3 were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

Production Example 1

Synthesis of Polymeric Compound (1)

7.77 g (45.71 mmol) of the [compound 1] shown below, 11.99 g (45.71 mmol) of the [compound 2] shown below, 6.22 g (17.78 mmol) of the [compound 3] shown below which was obtained in the aforementioned Synthesis Example 2, and 1.80 g (7.62 mmol) of the [compound 4] shown below were charged into to a 500 ml beaker, and were dissolved in 127.16 g of methyl ethyl ketone. Then, 4.1 mmol of dimethyl azobisisobutyrate (V-601) as a radical polymerization initiator was added to and dissolved in the resulting solution. The reaction solution was dropwise added to 52.98 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (1) as an objective compound.

With respect to the polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 7,400, and the dispersity was 1.74.

Further, the polymeric compound (1) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=45.3/23.4/20/11.3.

Production Example 2

Synthesis of Polymeric Compound (2)

7.03 g (41.36 mmol) of the [compound 1] shown below, 11.99 g (45.71 mmol) of the [compound 2] shown below, 3.43 g (9.79 mmol) of the [compound 3] shown below which was obtained in the aforementioned Synthesis Example 2, and 1.80 g (7.62 mmol) of the [compound 4] shown below were charged into to a 500 ml beaker, and were dissolved in 113.04 g of methyl ethyl ketone. Then, 3.6 mmol of dimethyl azobisisobutyrate (V-601) as a radical polymerization initiator was added to and dissolved in the resulting solution. The reaction solution was dropwise added to 47.10 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (2) as an objective compound (the chemical formula of the polymeric compound (2) is the same as that of the polymeric compound (1)).

With respect to the polymeric compound (2), the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.59.

Further, the polymeric compound (2) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=47.6/26.9/12.9/12.6.

Production Example 3

Synthesis of Polymeric Compound (3)

7.77 g (45.71 mmol) of the [compound 1] shown below, 31.14 g (118.85 mmol) of the [compound 2] shown below, 16.00 g (45.71 mmol) of the [compound 3] shown below which was obtained in the aforementioned Synthesis Example 2, and 4.32 g (18.28 mmol) of the [compound 4] shown below were charged into to a 500 ml beaker, and were dissolved in 236.92 g of methyl ethyl ketone. Then, 13.71 mmol of dimethyl azobisisobutyrate (V-601) as a radical polymerization initiator was added to and dissolved in the resulting solution. The reaction solution was dropwise added to 98.72 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 20 g of the polymeric compound (3) as an objective compound.

With respect to the polymeric compound (3), the weight average molecular weight (Mw) and the dispersity (Mw/Mn) were determined by the polystyrene equivalent value as measured by gel permeation chromatography (GPC). As a result, it was found that the weight average molecular weight was 7,000, and the dispersity was 1.51.

Further, the polymeric compound (3) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=30/40/20/10.

Production Example 4

Synthesis of Polymeric Compound (4)

3.42 g (20.11 mmol) of the [compound 1] shown below, 11.99 g (45.71 mmol) of the [compound 2] shown below, 5.22 g (15.54 mmol) of the [compound 3] shown below which was obtained in the aforementioned Synthesis Example 2, and 1.73 g (7.31 mmol) of the [compound 4] shown below were charged into to a 500 ml beaker, and were dissolved in 105.48 g of methyl ethyl ketone. Then, 2.2 mmol of dimethyl azobisisobutyrate (V-601) as a radical polymerization initiator was added to and dissolved in the resulting solution. The reaction solution was dropwise added to 43.95 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 20 g of the polymeric compound (4) as an objective compound.

With respect to the polymeric compound (4), the weight average molecular weight (Mw) and the dispersity (Mw/Mn) were determined by the polystyrene equivalent value as measured by gel permeation chromatography (GPC). As a result, it was found that the weight average molecular weight was 7,800, and the dispersity was 1.59.

Further, the polymeric compound (4) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=30/50/10/10.

Production Example 5

Synthesis of Polymeric Compound (5)

3.11 g (18.28 mmol) of the [compound 1] shown below, 11.99 g (45.71 mmol) of the [compound 2] shown below, 6.40 g (18.28 mmol) of the [compound 3] shown below which was obtained in the aforementioned Synthesis Example 2, and 1.73 g (7.31 mmol) of the [compound 4] shown below were charged into to a 500 ml beaker, and were dissolved in 108.96 g of methyl ethyl ketone. Then, 3.1 mmol of dimethyl azobisisobutyrate (V-601) as a radical polymerization initiator was added to and dissolved in the resulting solution. The reaction solution was dropwise added to 45.40 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (5) as an objective compound.

With respect to the polymeric compound (5), the weight average molecular weight (Mw) and the dispersity (Mw/Mn) were determined by the polystyrene equivalent value as measured by gel permeation chromatography (GPC). As a result, it was found that the weight average molecular weight was 7,100, and the dispersity was 1.59.

Further, the polymeric compound (5) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=24.9/31.9/28.7/14.5.

Production Example 6

Synthesis of Polymeric Compound (6)

2.93 g (17.23 mmol) of the [compound 1] shown below, 11.99 g (45.71 mmol) of the [compound 2] shown below, 2.89 g (8.25 mmol) of the [compound 3] shown below which was obtained in the aforementioned Synthesis Example 2, and 1.59 g (6.74 mmol) of the [compound 4] shown below were charged into to a 500 ml beaker, and were dissolved in 93.64 g of methyl ethyl ketone. Then, 2.7 mmol of dimethyl azobisisobutyrate (V-601) as a radical polymerization initiator was added to and dissolved in the resulting solution. The reaction solution was dropwise added to 39.02 g of methyl ethyl ketone heated to 75° C. in a separable flask over 6 hours in a nitrogen atmosphere. Thereafter, the reaction solution was heated for 1 hour while stirring, and then cooled to room temperature. The resulting polymer solution was concentrated under reduced pressure, and dropwise added to an excess amount of a mixed solution containing methanol and water so as to precipitate the reaction product (copolymer). The precipitated reaction product was separated by filtration, followed by washing and drying, thereby obtaining 15 g of the polymeric compound (6) as an objective compound.

With respect to the polymeric compound (6), the weight average molecular weight (Mw) and the dispersity (Mw/Mn) were determined by the polystyrene equivalent value as measured by gel permeation chromatography (GPC). As a result, it was found that the weight average molecular weight was 7,100, and the dispersity was 1.52.

Further, the polymeric compound (6) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=29.0/38.9/16.5/15.6.

Production Example 7

Synthesis Of Polymeric Compound (7)

With the exception of changing the compound (2) to 10.71 g (45.71 mmol) of a compound (5), the same procedure as in Production Example 6 was performed to effect a polymerization reaction, followed by purification, thereby obtaining 15 g of a polymeric compound (7) as an objective compound.

With respect to the polymeric compound (7), the weight average molecular weight and the dispersity were determined by the polystyrene equivalent value as measured by gel permeation chromatography (GPC). As a result, it was found that the weight average molecular weight was 7,200, and the dispersity was 1.55.

Further, the polymeric compound (7) was analyzed by carbon 13 nuclear magnetic resonance spectroscopy (600 MHz, $^{13}$C-NMR). As a result, it was found that the composition of the polymer (ratio (molar ratio) of the respective structural units within the structural formula) was l/m/n/o=28.4/39.5/16.9/15.2.

[Chemical Formula 40.]

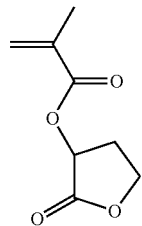

Compound 1

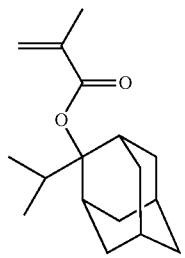

Compound 2

Compound 3
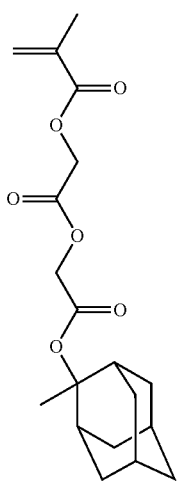
Compound 4
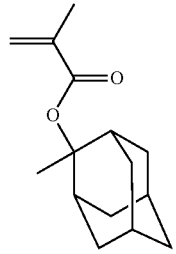
Compound 5
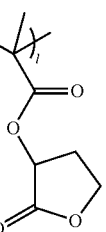
[Chemical Formula 41.]
Polymeric compounds (1) to (6)
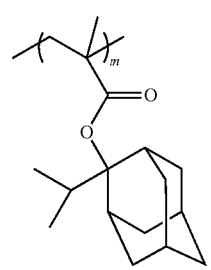
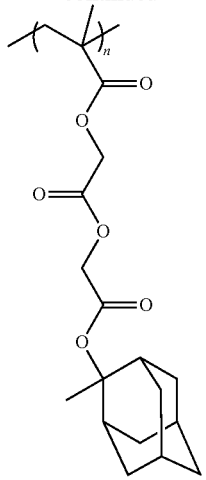
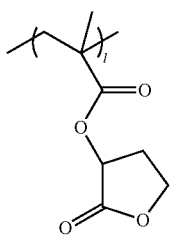
[Chemical Formula 42.]
Polymeric compound (7)
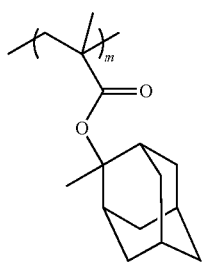

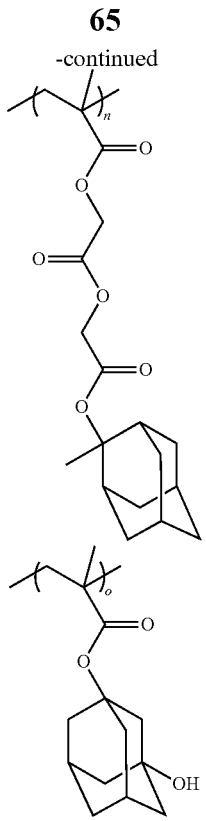

Synthesis Example 3

Synthesis of Compound (II)

(i) 150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%).

[Chemical Formula 43.]

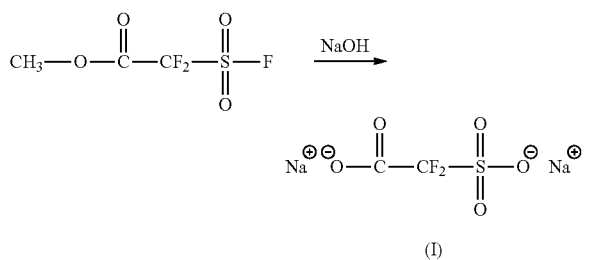

(ii) 56.2 g of the compound (I) and 562.2 g of acetonitrile were prepared, and 77.4 g of p-toluenesulfonic acid monohydrate was added thereto. The resultant was refluxed at 110° C. for 3 hours. Then, the reaction mixture was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

[Chemical Formula 44.]

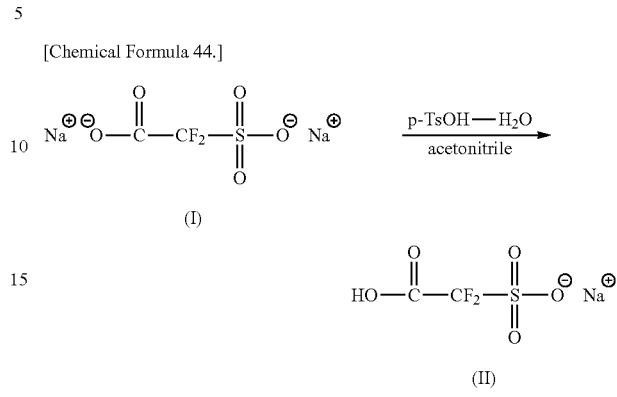

Synthesis Example 4

Synthesis of Compound (VI)

(i) 4.34 g of a compound (II) (purity: 94.1%), 3.14 g of 2-benzyloxyethanol and 43.4 g of toluene were prepared, 0.47 g of p-toluenesulfonic acid monohydrate was added thereto, and the resultant was refluxed at 105° C. for 20 hours. Then, the reaction mixture was filtered, and 20 g of hexane was added to the residue and stirred. Thereafter, the resultant was filtered, and the residue was dried, thereby obtaining 1.41 g of a compound (III) (yield: 43.1%).

[Chemical Formula 45.]

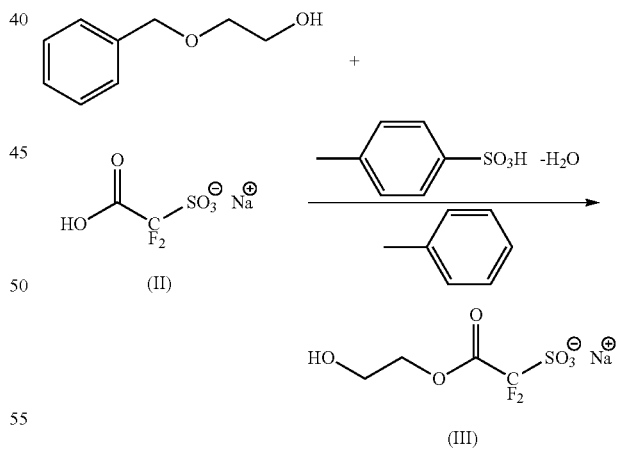

(ii) To 1.00 g of the compound (III) and 3.00 g of acetonitrile were dropwise added 0.82 g of 1-adamantanecarbonyl chloride and 0.397 g of triethylamine while cooling with ice. Then, the resultant was stirred at room temperature for 20 hours, followed by filtration. The filtrate was concentrated and dried, and dissolved in 30 g of dichloromethane, followed by washing with water three times. Thereafter, the organic phase was concentrated and dried, thereby obtaining 0.82 g of a compound (IV) (yield: 41%).

[Chemical Formula 46.]

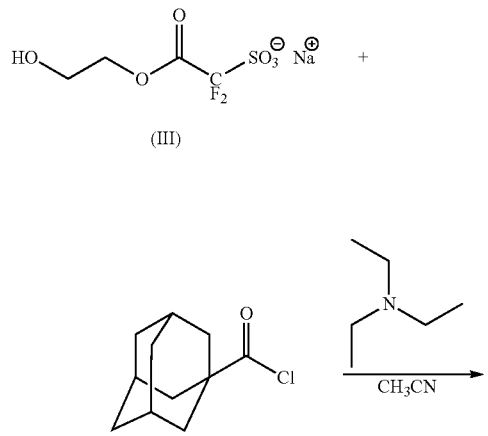

(III)

(IV)

[Chemical Formula 47.]

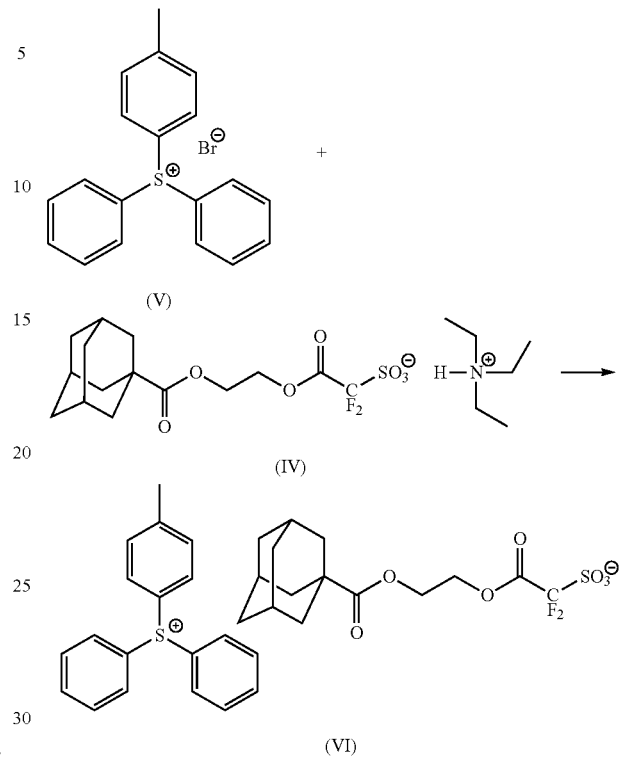

(V)

(IV)

(VI)

(iii) 0.384 g of a compound (V) was dissolved in 3.84 g of dichloromethane and 3.84 g of water, and 0.40 g of the compound (IV) was added thereto. The resultant was stirred for 1 hour, followed by liquid separation to collect the organic phase. The organic phase was washed with 3.84 g of water three times. Thereafter, the resulting organic phase was concentrated and dried, thereby obtaining 0.44 g of a compound (VI) (yield: 81.5%).

Examples 1 to 6

Comparative Examples 1 to 3

The components shown in Table 1 were mixed together and dissolved to obtain positive resist compositions.

TABLE 1

|  | Formulation [parts by weight] | | | | | Target size | | |
| --- | --- | --- | --- | --- | --- | --- | --- | --- |
|  | Component (A) | Component (B) | Component (D) | Component (S) | PAB/PEB (° C.) | (nm) (hole diameter/pitch) | Sensitivity (mJ/cm$^2$) | Shape |
| Ex. 1 | (A)-1 [100] | (B)-1 [11.0] | (D)-1 [1.0] | (S)-1 [2200] | 90/80 | 70/113 | 36 | A |
| Ex. 2 | (A)-2 [100] | (B)-1 [11.0] | (D)-1 [1.0] | (S)-1 [2200] | 90/80 | 70/113 | 33 | A |
| Ex. 3 | (A)-3 [100] | (B)-1 [11.0] | (D)-1 [1.0] | (S)-1 [2200] | 90/80 | 70/113 | 33 | A |
| Ex. 4 | (A)-4 [100] | (B)-1 [11.0] | (D)-1 [1.0] | (S)-1 [2200] | 90/80 | 70/113 | 32 | A |
| Ex. 5 | (A)-5 [100] | (B)-1 [11.0] | (D)-1 [1.0] | (S)-1 [2200] | 90/80 | 70/113 | 33 | A |
| Ex. 6 | (A)-6 [100] | (B)-1 [11.0] | (D)-1 [1.0] | (S)-1 [2200] | 90/80 | 70/113 | 32 | A |
| Comp. Ex. 1 | (A')-1 [100] | (B)-1 [11.0] | (D)-1 [1.0] | (S)-1 [2200] | 90/80 | 70/113 | 29 | B |
| Comp. Ex. 2 | (A')-2 [100] | (B)-1 [11.0] | (D)-1 [1.0] | (S)-1 [2200] | 90/80 | 70/113 | 26 | B |
| Comp. Ex. 3 | (A')-3 [100] | (B)-1 [11.0] | (D)-1 [1.0] | (S)-1 [2200] | 90/80 | 70/113 | — | — |

In Table 1, the values in brackets [ ] indicate the amount (in terms of parts by weight) of the component added. Further, the reference characters indicate the following.

(A)-1: the aforementioned polymeric compound (1)

(A)-2: the aforementioned polymeric compound (2)

(A)-3: the aforementioned polymeric compound (3)

(A)-4: the aforementioned polymeric compound (4)

(A)-5: the aforementioned polymeric compound (5)

(A)-6: the aforementioned polymeric compound (6)

(A')-1: a copolymer represented by chemical formula (A')-1 shown below [in the formula, l/m/o=30/50/20], which has a weight average molecular weight (Mw) of 7,000 and a dispersity (Mw/Mn) of 2.0

(A')-2: a copolymer represented by chemical formula (A')-2 shown below [in the formula, l/m/o=30/50/20], which has a weight average molecular weight (Mw) of 7,000 and a dispersity (Mw/Mn) of 2.0

(A')-3: the aforementioned polymeric compound (7)

(B)-1: the aforementioned compound (VI)

(D)-1: stearyldiethanolamine (S)-1: a mixed solvent of PGMEA/PGME=6/4 (weight ratio)

[Chemical Formula 48.]

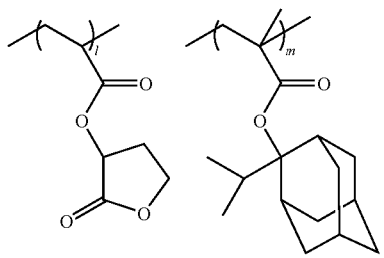

(A')-1

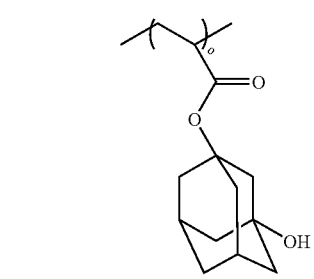

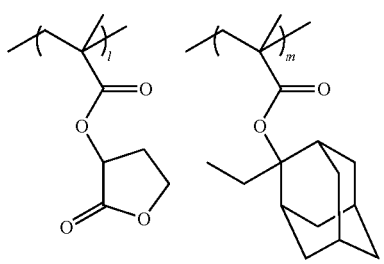

(A')-2

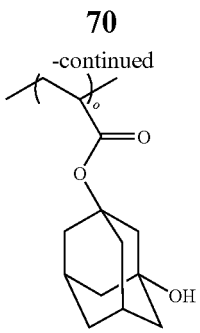

-continued

Using the obtained positive resist compositions, resist patterns were formed in the following manner, and the lithography properties were evaluated.

[Resolution and Sensitivity]

An organic anti-reflection film composition (product name: ARC29A, manufactured by Brewer Science Ltd.) was applied onto an 12-inch silicon wafer using a spinner, and the composition was then baked at 205° C. for 60 seconds, thereby forming an organic anti-reflection film having a film thickness of 89 nm. Then, each of the positive resist compositions obtained in Examples 1 to 6 and Comparative Examples 1 to 3 was applied onto the anti-reflection film using a spinner, and was then prebaked (PAB) on a hotplate at 90° C. for 60 seconds and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 28 nm.

Thereafter, using an ArF exposure apparatus for immersion lithography (product name: NSR-S609B, manufactured by Nikon Corporation, NA (numerical aperture)=1.07, 2/3 annular illumination, reduction ratio: 1/4, immersion medium: water), the resist film having a top coat formed thereon was selectively irradiated with an ArF excimer laser (193 nm) through a mask pattern (6% halftone) targeting a contact hole pattern having a target size (hole diameter (nm)/pitch (nm)) indicated in Table 1.

Next, the top coat was removed using a protection-film removing solution (product name: TS-Rememover-S; manufactured by Tokyo Ohka Kogyo Co., Ltd.). Then, a post exposure bake (PEB) treatment was conducted at 80° C. for 60 seconds, followed by development for 30 seconds at 23° C. in a 2.38% by weight aqueous solution of tetramethylammonium hydroxide (product name: NMD-W; manufactured by Tokyo Ohka Kogyo Co., Ltd.). Then, the resist film was rinsed for 25 seconds with pure water, followed by drying by shaking.

As a result, in each of Examples 1 to 6 and Comparative Example 1 and 2, a contact hole pattern with a hole diameter of 70 nm and a pitch of 113 nm was formed. In Comparative Example 3, a pattern could not be resolved.

The optimum exposure dose (Eop, mJ/cm$^2$) with which the contact hole pattern was formed, i.e., sensitivity, is shown in Table 1.

[Shape]

Each of the contact hole patterns formed above was observed from the upper side thereof using a scanning electron microscope (SEM), and the circularity was evaluated with the following criteria. The results are shown in Table 1.

A: the hole pattern as a whole exhibited high circularity (only slight unevenness was observed at the circumferential portions of the hole pattern when the hole pattern was observed from the upper side thereof), and the pattern shape was excellent B: a portion of the holes within the hole pattern was connected, and circularity of the pattern was low As seen from the results above, it was confirmed that by using the positive resist composition of the present invention, a contact hole pattern having a hole diameter of 70 nm and a pitch of 113 nm (i.e., a fine pattern having a size of no more than 100 nm and a narrow pitch) could be formed without deteriorating the shape thereof. Therefore, it was found that the positive resist composition of the present invention exhibits excellent lithography properties.

The invention claimed is:

1. A positive resist composition comprising a base component (A) which exhibits increased solubility in an alkali developing solution under action of acid and an acid-generator component (B) which generates acid upon exposure,
said base component (A) comprising a polymeric compound (A1) comprising a structural unit (a0-1) represented by general formula (a0-1-1) shown below and a structural unit (a0-2) represented by general formula (a0-2) shown below:

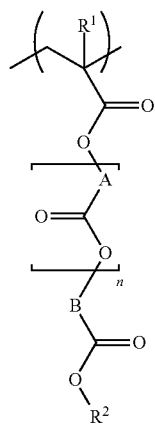

(a0-1-1)

wherein $R^1$ represents a hydrogen atom, a lower alkyl group or a halogenated lower alkyl group; A represents a linear aliphatic hydrocarbon group; B represents a divalent linking group; $R^2$ represents an acid dissociable, dissolution inhibiting group; and n represents 1; and

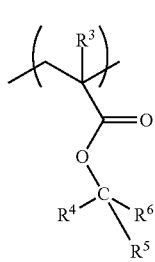

(a0-2)

wherein $R^3$ represents a hydrogen atom, a lower alkyl group or a halogenated lower alkyl group; $R^4$ represents a branched alkyl group of 3 or more carbon atoms; and each of $R^5$ and $R^6$ independently represents an alkyl group, wherein $R^5$ and $R^6$ are mutually bonded to form a ring.

2. The positive resist composition according to claim 1, wherein said polymeric compound (A1) further comprises a structural unit (a2) derived from an acrylate ester containing a lactone-containing cyclic group.

3. The positive resist composition according to claim 1, wherein said polymeric compound (A1) further comprises a structural unit (a3) derived from an acrylate ester containing a polar group-containing aliphatic hydrocarbon group.

4. The positive resist composition according to claim 1, which further comprises a nitrogen-containing organic compound (D).

5. A method of forming a resist pattern, comprising: applying a positive resist composition of claim 1 to a substrate to form a resist film on the substrate; conducting exposure of said resist film; and alkali-developing said resist film to form a resist pattern.

6. A polymeric compound comprising a structural unit (a0-1) represented by general formula (a0-1-1) shown below and a structural unit (a0-2) represented by general formula (a0-2) shown below:

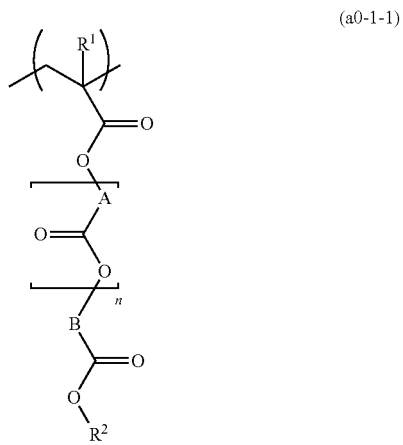

(a0-1-1)

wherein $R^1$ represents a hydrogen atom, a lower alkyl group or a halogenated lower alkyl group;
A represents a linear aliphatic hydrocarbon group; B represents a divalent linking group; $R^2$ represents an acid dissociable, dissolution inhibiting group; and n represents 1; and

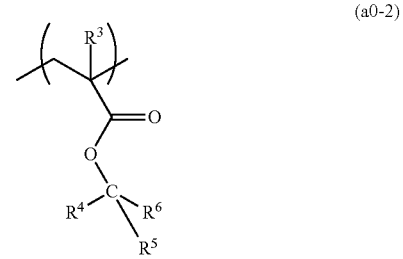

(a0-2)

wherein $R^3$ represents a hydrogen atom, a lower alkyl group or a halogenated lower alkyl group; $R^4$ represents a branched alkyl group of 3 or more carbon atoms; and each of $R^5$ and $R^6$ independently represents an alkyl group, wherein $R^5$ and $R^6$ are mutually bonded to form a ring.

7. The polymeric compound according to claim 6, which further comprises a structural unit (a2) derived from an acrylate ester containing a lactone-containing cyclic group.

8. The polymeric compound according to claim 6, which further comprises a structural unit (a3) derived from an acrylate ester containing a polar group-containing aliphatic hydrocarbon group.

* * * * *

UNITED STATES PATENT AND TRADEMARK OFFICE
CERTIFICATE OF CORRECTION

PATENT NO.        : 8,088,553 B2
APPLICATION NO.   : 12/425706
DATED             : January 3, 2012
INVENTOR(S)       : Hiroaki Shimizu et al.

It is certified that error appears in the above-identified patent and that said Letters Patent is hereby corrected as shown below:

IN THE SPECIFICATIONS:

At Column 2, Line 8, Change "C-position." to --α-position.--.

At Column 17, Line 28 (Approx.), Change "C-position" to --α-position.--.

At Column 19, Line 26, Change "C-position" to --α-position.--.

At Column 23, Line 35 (Approx.), Change "(a3-3-4)" to --(a2-3-4)--.

At Column 23, Line 48 (Approx.), Change "(a3-3-5)" to --(a2-3-5)--.

At Column 23, Line 58 (Approx.), Change "(a3-3-6)" to --(a2-3-6)--.

At Column 24, Line 2 (Approx.), Change "(a3-3-7)" to --(a2-3-7)--.

At Column 24, Line 15 (Approx.), Change "(a3-3-8)" to --(a2-3-8)--.

At Column 24, Line 28 (Approx.), Change "(a3-3-9)" to --(a2-3-9)--.

At Column 24, Line 40 (Approx.), Change "(a3-3-10)" to --(a2-3-10)--.

At Column 25, Lines 58-66 (Approx.), Change " 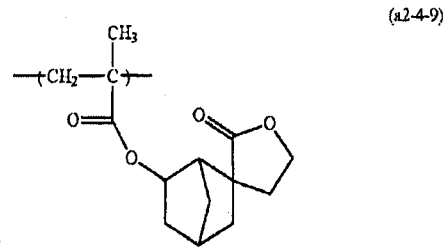 " to -- 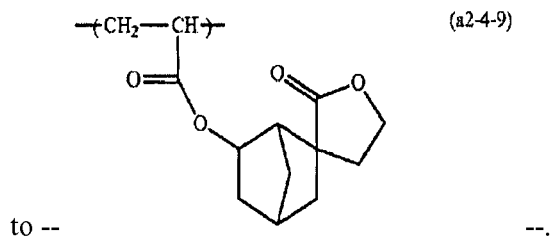 --.

At Column 29, Line 30 (Approx.), Change "norbonyl" to --norbornyl--.

Signed and Sealed this
Nineteenth Day of June, 2012

David J. Kappos
*Director of the United States Patent and Trademark Office*

CERTIFICATE OF CORRECTION (continued)
U.S. Pat. No. 8,088,553 B2

At Column 29, Line 35 (Approx.), Change "2-norbonyl" to --2-norbornyl--.

At Column 29, Line 35 (Approx.), Change "3-norbonyl" to --3-norbornyl--.

At Column 29, Line 38 (Approx.), Change "norbonyl" to --norbornyl--.

At Column 36, Line 7, Change ""X-Q$^1$-Y—"," to --"X-Q$^1$-Y$^1$—",--.

At Column 37, Line 7, Change "fluororinated" to --fluorinated--.

At Column 43, Lines 13-18 (Approx.), Change "  to -- 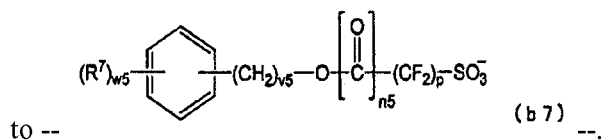 --.

At Column 43, Lines 43-46, Change " 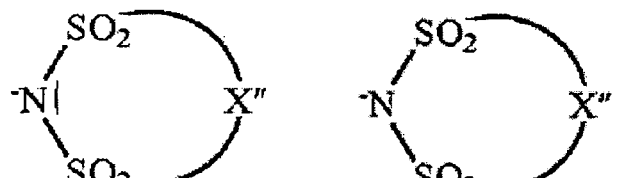 " to -- 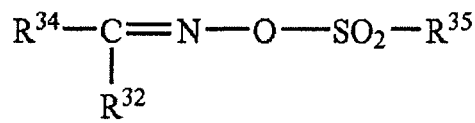 --.

At Column 46, Lines 28-30 (Approx.), Change " 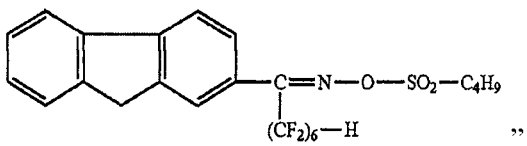 to -- 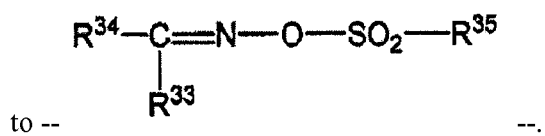 --.

At Column 48, Lines 24-27 (Approx.), Change " 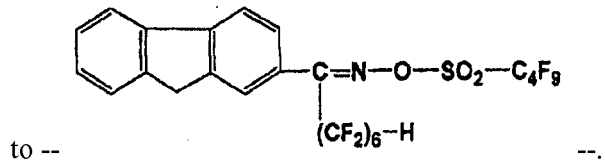 " to -- 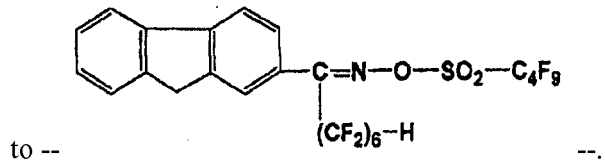 --.

CERTIFICATE OF CORRECTION (continued)
U.S. Pat. No. 8,088,553 B2

At Column 48, Lines 28-32, (Approx.), Change " 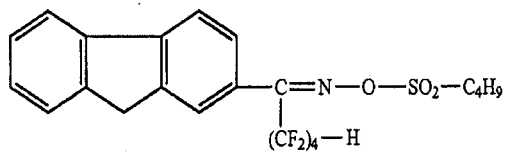 "

to -- 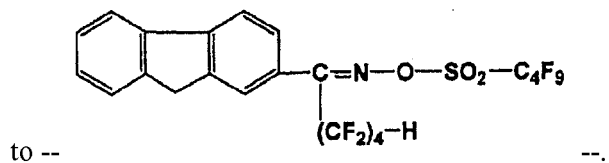 --.

At Column 53, Line 11, After "long" change "at" to --as--.

At Column 70, Line 43, Change "TS-Rememover-S;" to --TS-Remover-S;--.

At Column 70, Line 67, After "excellent" insert --.--.

At Column 71, Line 2, After "low" insert --.--.